(12) United States Patent
Ganti et al.

(10) Patent No.: US 12,240,750 B2
(45) Date of Patent: Mar. 4, 2025

(54) TILES HAVING MULTIPLE COOLING CELLS FOR MEMS-BASED COOLING

(71) Applicant: Frore Systems Inc., San Jose, CA (US)

(72) Inventors: Suryaprakash Ganti, Los Altos, CA (US); Seshagiri Rao Madhavapeddy, La Jolla, CA (US); Vikram Mukundan, San Ramon, CA (US); Ananth Saran Yalamarthy, Stanford, CA (US); Prabhu Sathyamurthy, San Jose, CA (US); Brian James Gally, Los Gatos, CA (US)

(73) Assignee: Frore Systems Inc., San Jose, CA (US)

(*) Notice: Subject to any disclaimer, the term of this patent is extended or adjusted under 35 U.S.C. 154(b) by 565 days.

(21) Appl. No.: 17/474,815

(22) Filed: Sep. 14, 2021

(65) Prior Publication Data

US 2022/0081284 A1 Mar. 17, 2022

Related U.S. Application Data

(60) Provisional application No. 63/220,862, filed on Jul. 12, 2021, provisional application No. 63/220,371, filed on Jul. 9, 2021, provisional application No. 63/079,450, filed on Sep. 16, 2020.

(51) Int. Cl.
*B81B 7/00* (2006.01)
*H05K 7/20* (2006.01)

(52) U.S. Cl.
CPC .......... *B81B 7/0061* (2013.01); *B81B 7/0093* (2013.01); *H05K 7/20145* (2013.01); *H05K 7/20272* (2013.01); *B81B 2203/0118* (2013.01)

(58) Field of Classification Search
None
See application file for complete search history.

(56) References Cited

U.S. PATENT DOCUMENTS

2018/0168066 A1* 6/2018 Xu ..................... H05K 7/20154

* cited by examiner

*Primary Examiner* — Bo B Jang
(74) *Attorney, Agent, or Firm* — Van Pelt, Yi & James LLP

(57) ABSTRACT

A system including a plurality of cooling cells is described. Each of the cooling cells includes a support structure and a cooling element. The cooling element has a central region having an axis and a perimeter. The cooling element IS supported by the support structure at the central region and along the axis. At least a portion of the perimeter being unpinned. The cooling element is configured to undergo vibrational motion when actuated to drive a fluid toward a heat-generating structure. A portion of the cooling cells aligned along the axis are physically connected such that the cooling cells form an integrated cooling cell tile.

13 Claims, 14 Drawing Sheets

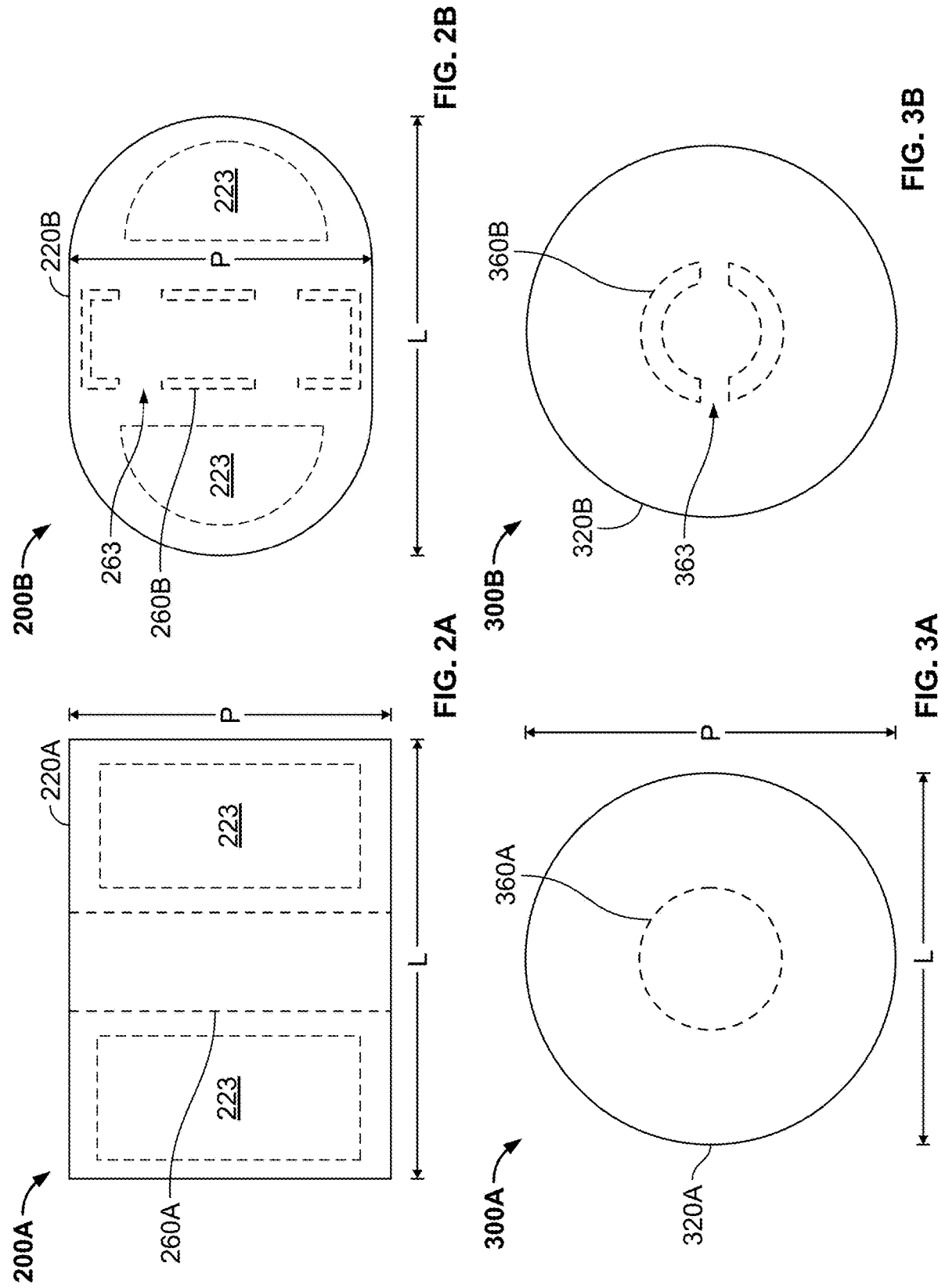

TILES HAVING MULTIPLE COOLING CELLS FOR MEMS-BASED COOLING

CROSS REFERENCE TO OTHER APPLICATIONS

This application claims priority to U.S. Provisional Patent Application No. 63/079,450 entitled TILES HAVING MULTIPLE COOLING CELLS FOR MEMS-BASED COOLING filed Sep. 16, 2020, U.S. Provisional Patent Application No. 63/220,371 entitled MEMS-BASED ACTIVE COOLING SYSTEMS INCLUDING COOLING CELL ARRANGEMENT, TABS, ANCHOR BONDING, INTEGRATED SPREADER, ADHESIVE, AND POWER MANAGEMENT filed Jul. 9, 2021, and U.S. Provisional Patent Application No. 63/220,862 entitled PIEZOELECTRIC ACTIVE MEMS COOLING SYSTEMS INCLUDING ENGINEERED ACTUATORS, TAILORED ORIFICES, CONTROLLED GAPS, AND STRIP LEVEL MANUFACTURING filed Jul. 12, 2021, all of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired.

BRIEF DESCRIPTION OF THE DRAWINGS

Various embodiments of the invention are disclosed in the following detailed description and the accompanying drawings.

FIGS. 2A-2B depict embodiments of cooling elements usable in active cooling systems including centrally anchored cooling elements.

FIGS. 3A-3B depict embodiments of cooling elements usable in active cooling systems including centrally anchored cooling elements.

DETAILED DESCRIPTION

Figure 1A:
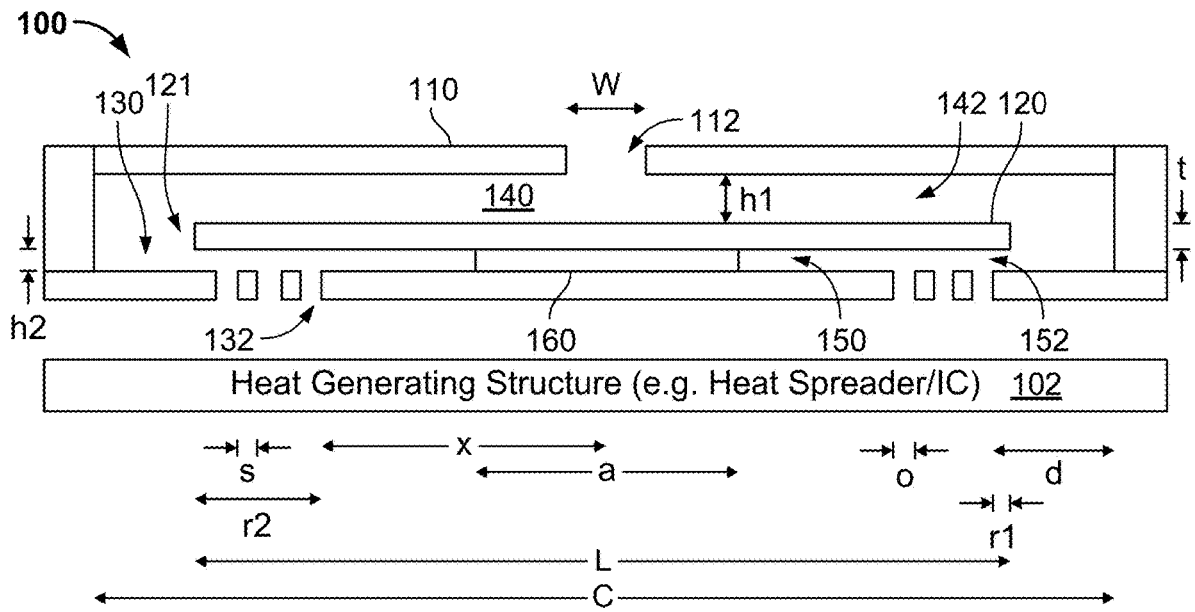
FIGS. 1A-1F depict an embodiment of an active cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated.

Varying configurations of computing devices further complicate heat management. For example, computing devices such as laptops are frequently open to the external environment while other computing devices, such as smartphones, are generally closed to the external environment. Thus, active heat management solutions for open devices, such as fans, may be inappropriate for closed devices. A fan driving heated fluid from the inside of the computing device to the outside environment may be too large for closed computing devices such as smartphones and may provide limited fluid flow. In addition, the closed computing device has no outlet for the heated fluid even if the fan can be incorporated into the closed computing device. Thus, the thermal management provided by such an open-device mechanism may have limited efficacy. Even for open computing devices, the location of the inlet and/or outlet may be configured differently for different devices. For example, an outlet for fan-driven fluid flow in a laptop may be desired to be located away from the user's hands or other structures that may lie within the outflow of heated fluid. Such a configuration not only prevents the user's discomfort but also allows the fan to provide the desired cooling. Another mobile device having a different configuration may require the inlets and/or outlets to be configured differently, may reduce the efficacy of such heat management systems and may prevent the use of such heat management systems. Thus, mechanisms for improving cooling in computing devices are desired.

A system including a plurality of cooling cells is described. Each of the cooling cells includes a support structure and a cooling element. The cooling element has a central region having an axis and a perimeter. The cooling element IS supported by the support structure at the central region and along the axis. At least a portion of the perimeter being unpinned. The cooling element is configured to undergo vibrational motion when actuated to drive a fluid toward a heat-generating structure. A portion of the cooling cells aligned along the axis are physically connected such that the cooling cells form an integrated cooling cell tile.

In some embodiments, the system also includes an electrical connection coupled to each of the portion of the plurality of cooling cells along the axis. A pedestal may couple each of the portion of the cooling cells to the heat-generating structure. The pedestal is aligned with the axis. The portion of the cooling cells along the axis may be physically connected by the pedestal. In some embodiments, the portion of the cooling cells along the axis are physically connected by a shared support structure. The shared support structure forms the support structure for each of the portion of the cooling cells. In some embodiments, the cooling cells are mechanically connected by tab(s) residing outside of a footprint of the plurality of cooling cells.

In some embodiments, the system includes an additional plurality of cooling cells, which are analogous to the plurality of cooling cells. The additional plurality of cooling cells form an additional integrated cooling cell tile. The integrated cooling cell tile and the additional integrated cooling cell tile are coupled to the heat-generating structure.

A system including an integrated cooling cell tile is also described. The cooling cell tile includes a plurality of cooling cells, a plurality of integrated tabs, and an electrical connector. Each of the cooling cells includes a support structure and a cooling element. The cooling element has a central region having an axis and a perimeter. The cooling element is supported by the support structure at the central region and along the axis. At least a portion of the perimeter is unpinned. The cooling element is configured to undergo vibrational motion when actuated to drive a fluid toward a heat-generating structure. A first portion of the cooling cells aligned along the axis are physically connected. The integrated tabs are mechanically connecting to a second portion of cooling cells. The electrical connector includes at least one longitudinal electrical connector extending along the axis and coupled to the portion of the plurality of cooling cells along the axis.

In some embodiments, the integrated cooling cell tile further includes pedestal(s) configured to couple each of the portion of the cooling cells to a heat generating-structure. The pedestal is aligned with the axis. The pedestal and/or the support structure physically connect the plurality of cooling cells.

A method is also described. The method includes providing cooling cells described herein. Aa portion of the plurality of cooling cells aligned along the axis are physically connected such that the plurality of cooling cells form an integrated cooling cell tile. Electrical connection is providing an electrical connection coupled to each of the portion of the plurality of cooling cells along the axis. The method may also provide a pedestal configured to couple each of the portion of the plurality of cooling cells to the heat-generating structure. The pedestal is aligned with the axis. In some embodiments, the portion of the cooling cells along the axis are physically connected by the pedestal. In some embodiments, the method includes providing the support structure as a shared support structure. The portion of the cooling cells along the axis being physically connected by the shared support structure. In some embodiments, providing the cooling cells includes mechanically connecting an additional portion of the cooling cells by at least one tab, the at least one tab residing outside of a footprint of the plurality of cooling cells.

FIG. 1A depicts cooling system 100 in a neutral position. Thus, cooling element 120 is shown as substantially flat. For in-phase operation, cooling element 120 is driven to vibrate between positions shown in FIGS. 1B and 1C. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Cooling element 120 can be considered to divide the interior of active cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1E). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1E, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1E. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1E) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C of chamber 140/150 is close to the length, L, of cooling element 120. For example, in some embodiments, the distance, d, between the edge of cooling element 120 and the wall of chamber 140/50 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, $C/2=n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of cooling element 120, in some embodiments, it is also approximately true that $L/2=n\lambda/4$, where $\lambda$ is the acoustic wavelength for the fluid and n is odd. Thus, the frequency at which cooling element 120 is driven, v, is at or near the structural resonant frequency for cooling element 120. The frequency v is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 13) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments r1 is at least one hundred micrometers (e.g. r1>100 μm) and r2 is not more than one millimeter (e.g. r2<1000 μm). In some embodiments, orifices 132 are at least two hundred micrometers from tip 121 of cooling element 120 (e.g. r1>200 μm). In some such embodiments, orifices 132 are at least three hundred micrometers from tip 121 of cooling element 120 (e.g. r1>300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling element though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or a Ti (e.g. a Ti alloy such as Ti6Al-4V). In some embodiments, piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Figure 1B:
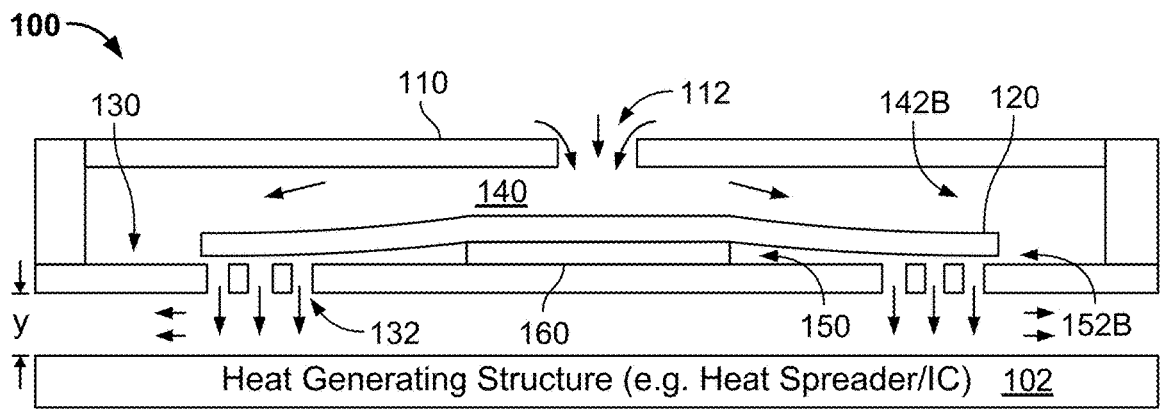
Figure 1C:
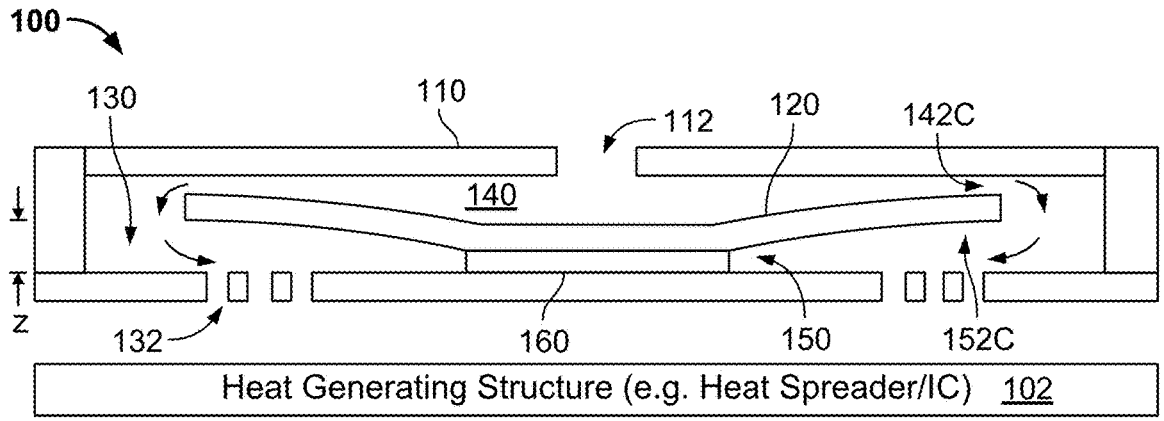

Operation of cooling system 100 is described in the context of FIGS. 1A-1E. Although described in the context of particular pressures, gap sizes, and timing of flow, operation of cooling system 100 is not dependent upon the explanation herein. FIGS. 1B-1C depict in-phase operation of cooling system 100. Referring to FIG. 1B, cooling element 120 has been actuated so that its tip 121 moves away from top plate 110. FIG. 1B can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1B. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1B.

Cooling element 120 is also actuated so that tip 121 moves away from heat-generating structure 102 and toward top plate 110. FIG. 1C can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1C. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1C. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 140. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1B and 1C is repeated. Thus, cooling element 120 undergoes vibrational motion indicated in FIGS. 1A-1C, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Figure 1D:
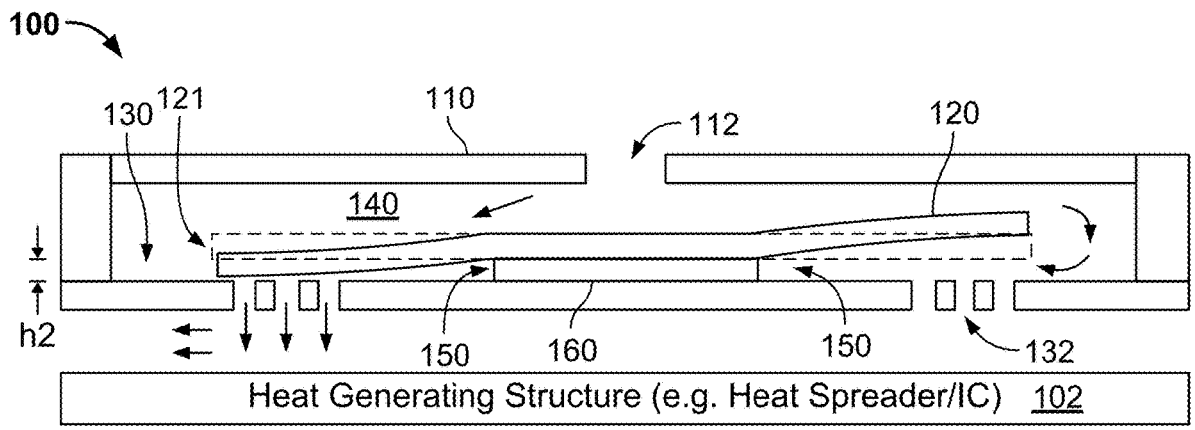
Figure 1E:
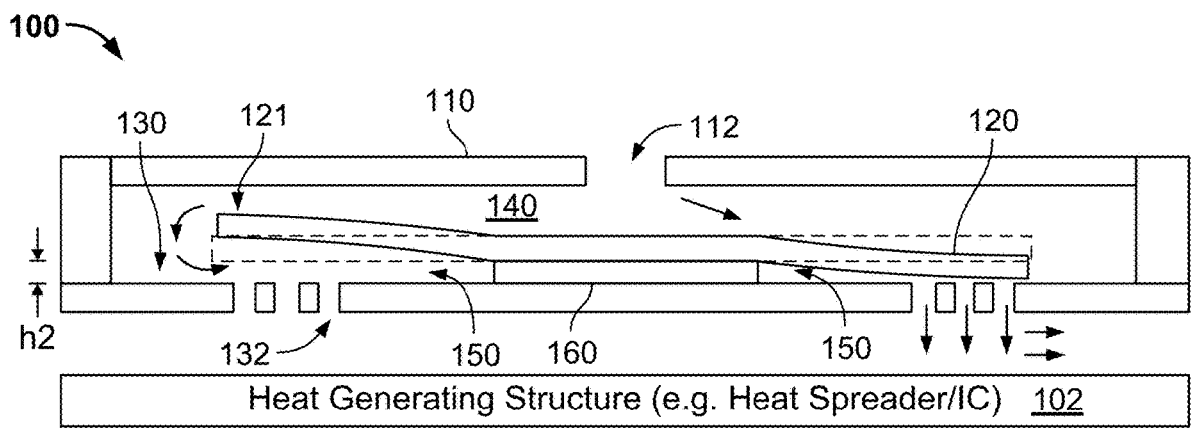

FIGS. 1D-1E depict an embodiment of active cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. The movement of fluid is shown by unlabeled arrows in FIGS. 1D and 1E.

The motion between the positions shown in FIGS. 1D and 1E is repeated. Thus, cooling element 120 undergoes vibrational motion indicated in FIGS. 1A, 1D, and 1E, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of cooling element 120. As a result, heat-generating structure 102 may be cooled.

Figure 1F:
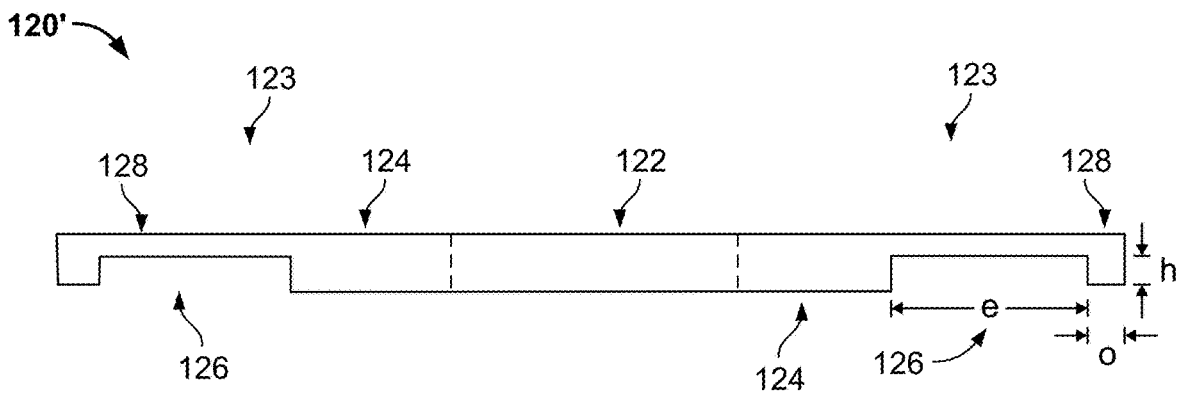

Although shown in the context of a uniform cooling element in FIGS. 1A-1E, cooling system 100 may utilize cooling elements having different shapes. FIG. 1F depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1F, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 100 to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

FIGS. 2A-2B depict plan views of embodiments of cooling systems 200A and 200B analogous to active cooling systems such as cooling system 100. FIGS. 2A and 2B are not to scale. For simplicity, only portions of cooling elements 220A and 220B and anchors 260A and 260B, respectively, are shown. Cooling elements 220A and 220B are analogous to cooling element 120/120'. Thus, the sizes and/or materials used for cooling elements 220A and/or 220B may be analogous to those for cooling element 120/120'. Anchors (support structures) 260A and 260B are analogous to anchor 160 and are indicated by dashed lines.

For cooling elements 220A and 220B, anchors 260A and 260B are centrally located and extend along a central axis of cooling elements 220A and 220B, respectively. Thus, the cantilevered portions that are actuated to vibrate are to the right and left of anchors 260A and 260B. In some embodiments, cooling element(s) 220A and/or 220B are continuous structures, two portions of which are actuated (e.g. the cantilevered portions outside of anchors 260A and 260B). In some embodiments, cooling element(s) 220A and/or 220B include separate cantilevered portions each of which is attached to the anchors 260A and 260B, respectively, and actuated. Cantilevered portions of cooling elements 220A and 220B may thus be configured to vibrate in a manner analogous to the wings of a butterfly (in-phase) or to a seesaw (out-of-phase). In FIGS. 2A and 2B, L is the length of the cooling element, analogous to that depicted in FIGS. 1A-1E. Also in FIGS. 2A and 2B, the depth, P, of cooling elements 220A and 220B is indicated.

Also shown by dotted lines in FIGS. 2A-2B are piezoelectric 223. Piezoelectric 223 is used to actuate cooling elements 220A and 220B. In some embodiments, piezoelectric 223 may be located in another region and/or have a different configuration. Although described in the context of a piezoelectric, another mechanism for actuating cooling elements 220A and 220B can be utilized. Such other mechanisms may be at the locations of piezoelectric 223 or may be located elsewhere. In cooling element 220A, piezoelectric 223 may be affixed to cantilevered portions or may be integrated into cooling element 220A. Further, although piezoelectric 223 is shown as having particular shapes and sizes in FIGS. 2A and 2B, other configurations may be used.

In the embodiment shown in FIG. 2A, anchor 260A extends the entire depth of cooling element 220A. Thus, a portion of the perimeter of cooling element 220A is pinned. The unpinned portions of the perimeter of cooling element 220A are part of the cantilevered sections that undergo vibrational motion. In other embodiments, anchor need not extend the entire length of the central axis. In such embodiments, the entire perimeter of the cooling element is unpinned. However, such a cooling element still has cantilevered sections configured to vibrate in a manner described herein. For example, in FIG. 2B, anchor 260B does not extend to the perimeter of cooling element 220B. Thus, the perimeter of cooling element 220B is unpinned. However, anchor 260B still extends along the central axis of cooling element 220B. Cooling element 220B is still actuated such that cantilevered portions vibrate (e.g. analogous to the wings of a butterfly).

Although cooling element 220 A is depicted as rectangular, cooling elements may have another shape. In some embodiments, corners of cooling element 220A may be rounded. Cooling element 220B of FIG. 2B has rounded cantilevered sections. Other shapes are possible. In the embodiment shown in FIG. 2B, anchor 260B is hollow and includes apertures 263. In some embodiments, cooling element 220B has aperture(s) in the region of anchor 260B. In some embodiments, cooling element 220B includes multiple portions such that aperture(s) exist in the region of anchor 260B. As a result, fluid may be drawn through cooling element 220B and through anchor 260B. Thus, cooling element 220B may be used in place of a top plate, such as top plate 110. In such embodiments, apertures in cooling element 220B and apertures 263 may function in an analogous manner to vent 112. Further, although cooling elements 200A and 200B are depicted as being supported in a central region, in some embodiments, one cantilevered section of the cooling element 220A and/or 220B might be omitted. In such embodiments, cooling element 220A and/or 220B may be considered to be supported, or anchored, at or near one edge, while at least part of at least the opposing edge is free to undergo vibrational motion. In some such embodiments, the cooling element 220A and/or 220B may include a single cantilevered section that undergoes vibrational motion.

FIGS. 3A-3B depict plan views of embodiments of cooling systems 300A and 300B analogous to active cooling systems such as cooling system 100. FIGS. 3A and 3B are not to scale. For simplicity, only cooling elements 320A and 320B and anchors 360A and 360B, respectively, are shown. Cooling elements 320A and 320B are analogous to cooling element 120/120'. Thus, the sizes and/or materials used for cooling elements 320A and/or 320B may be analogous to those for cooling element 120/120'. Anchors 360A and 360B are analogous to anchor 160 and are indicated by dashed lines.

For cooling elements 320A and 320B, anchors 360A and 360B, respectively, are limited to a central region of cooling elements 320A and 320B, respectively. Thus, the regions surrounding anchors 360A and 360B undergo vibrational motion. Cooling elements 320A and 320B may thus be configured to vibrate in a manner analogous to a jellyfish or similar to the opening/closing of an umbrella. In some embodiments, the entire perimeter of cooling elements 320A and 320B vibrate in phase (e.g. all move up or down together). In other embodiments, portions of the perimeter of cooling elements 320A and 320B vibrate out of phase. In FIGS. 3A and 3B, L is the length (e.g. diameter) of the cooling element, analogous to that depicted in FIGS. 1A-1E. Although cooling elements 320A and 320B are depicted as circular, cooling elements may have another shape. Further, a piezoelectric (not shown in FIGS. 3A-3B) and/or other mechanism may be used to drive the vibrational motion of cooling elements 320A and 320B.

In the embodiment shown in FIG. 3B, the anchor 360B is hollow and has apertures 363. In some embodiments, cooling element 320B has aperture(s) in the region of anchor 360B. In some embodiments, cooling element 320B includes multiple portions such that aperture(s) exist in the region of anchor 360B. As a result, fluid may be drawn through cooling element 320B and through anchor 360B. The fluid may exit through apertures 363. Thus, cooling element 320B may be used in place of a top plate, such as top plate 110. In such embodiments, apertures in cooling element 320B and apertures 363 may function in an analogous manner to vent 112.

Cooling systems such as cooling system 100 can utilize cooling element(s) 220A, 220B, 320A, 320B and/or analogous cooling elements. Such cooling systems may also share the benefits of cooling system 100. Cooling systems using cooling element(s) 220A, 220B, 320A, 320B and/or analogous cooling elements may more efficiently drive fluid toward heat-generating structures at high speeds. Consequently, heat transfer between the heat-generating structure and the moving fluid is improved. Because the heat-generating structure is more efficiently cooled, the corresponding device may exhibit improved operation, such as running at higher speed and/or power for longer times. Cooling systems employing cooling element(s) 220A, 220B, 320A, 320B and/or analogous cooling elements may be suitable for use in smaller and/or mobile devices in which limited space is available. Performance of such devices may thus be improved. Because cooling element(s) 220A, 220B, 320A, 320B and/or analogous cooling elements may be vibrated at frequencies of 15 kHz or more, users may not hear any noise associated with actuation of cooling elements. If driven at or near the acoustic and/or structural resonance frequencies for the cooling element(s) 220A, 220B, 320A, 320B and/or analogous cooling elements, the power used in operating cooling systems may be significantly reduced. Cooling element(s) 220A, 220B, 320A, 320B and/or analogous cooling elements may not physically contact the plates during use, allowing resonance to be more readily maintained. The benefits of improved, quiet cooling may be achieved with limited additional power. Consequently, performance of devices incorporating the cooling element(s) 220A, 220B, 320A, 320B and/or analogous cooling elements may be improved.

Figure 4A:
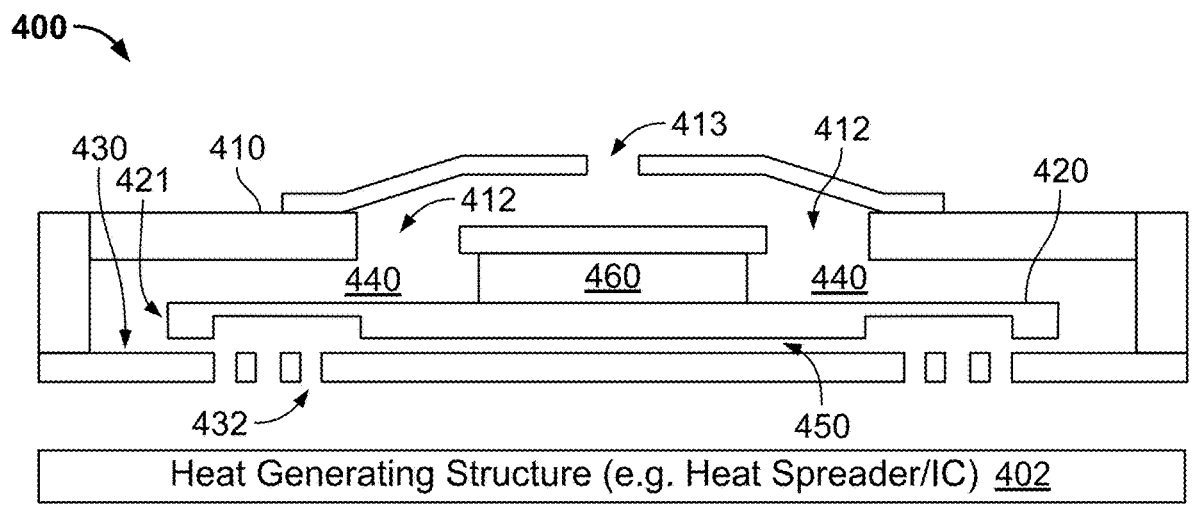
FIGS. 4A-4B depict an embodiment of an active cooling system including a centrally anchored cooling element.
Figure 4B:
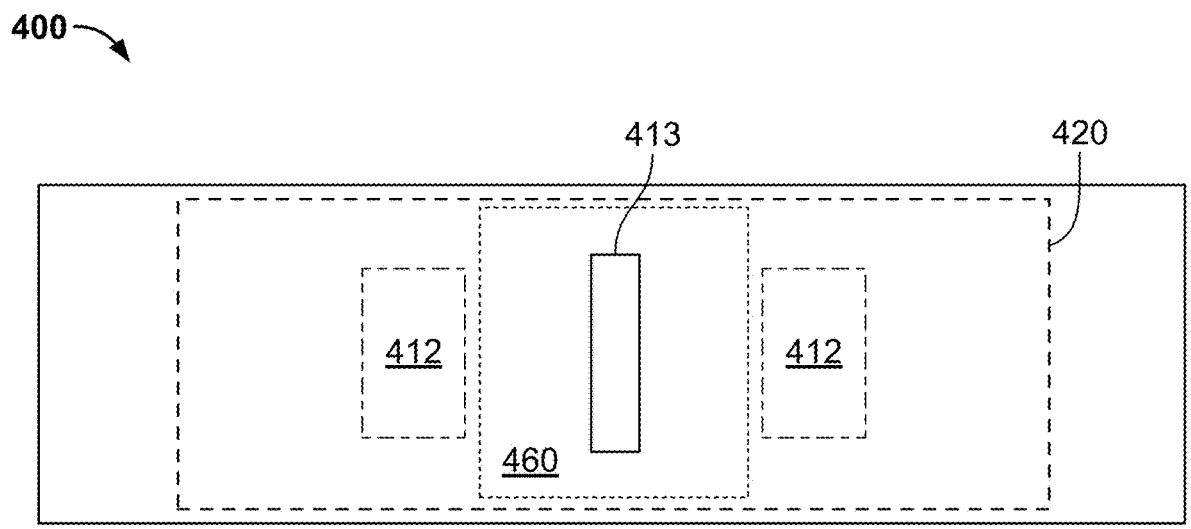

FIGS. 4A-4B depict an embodiment of active cooling system 400 including a top centrally anchored cooling element. FIG. 4A depicts a side view of cooling system 400 in a neutral position. FIG. 4B depicts a top view of cooling system 400. FIGS. 4A-4B are not to scale. For simplicity, only portions of cooling system 400 are shown. Referring to FIGS. 4A-10B, cooling system 400 is analogous to cooling system 100. Consequently, analogous components have similar labels. For example, cooling system 400 is used in conjunction with heat-generating structure 402, which is analogous to heat-generating structure 102.

Cooling system 400 includes top plate 410 having vents 412, cooling element 420, orifice plate 430 including orifices 432, top chamber 440 having a gap, bottom chamber 450 having a gap, flow chamber 440/450, and anchor (i.e. support structure) 460 that are analogous to top plate 110 having vent 112, cooling element 220, orifice plate 130 including orifices 132, top chamber 140 having gap 142, bottom chamber 150 having gap 152, flow chamber 140/150, and anchor (i.e. support structure) 160, respectively. Thus, cooling element 420 is centrally supported by anchor 460 such that at least a portion of the perimeter of cooling element 420 is free to vibrate. In some embodiments, anchor 460 extends along the axis of cooling element 420 (e.g. in a manner analogous to anchor 260A and/or 260B). In other embodiments, anchor 460 is only near the center portion of cooling element 420 (e.g. analogous to anchor 460C and/or 460D). Although not explicitly labeled in FIGS. 4A and 4B, cooling element 420 includes an anchored region and cantilevered arms including step region, extension region and outer regions analogous to anchored region 122, cantilevered arms 123, step region 124, extension region 126 and outer region 128 of cooling element 120'. In some embodiments, cantilevered arms of cooling element 420 are driven in-phase. In some embodiments, cantilevered arms of cooling element 420 are driven out-of-phase. In some embodiments, a simple cooling element, such as cooling element 120, may be used.

Anchor 460 supports cooling element 420 from above. Thus, cooling element 420 is suspended from anchor 460. Anchor 460 is suspended from top plate 410. Top plate 410 includes vent 413. Vents 412 on the sides of anchor 460 provide a path for fluid to flow into sides of chamber 440.

As discussed above with respect to cooling system 100, cooling element 420 may be driven to vibrate at or near the structural resonant frequency of cooling element 420. Further, the structural resonant frequency of cooling element 420 may be configured to align with the acoustic resonance of the chamber 440/1050. The structural and acoustic resonant frequencies are generally chosen to be in the ultrasonic range. For example, the vibrational motion of cooling element 420 may be at the frequencies described with respect to cooling system 100. Consequently, efficiency and flow rate may be enhanced. However, other frequencies may be used.

Cooling system 400 operates in an analogous manner to cooling system 100. Cooling system 400 thus shares the benefits of cooling system 100. Thus, performance of a device employing cooling system 400 may be improved. In addition, suspending cooling element 420 from anchor 460 may further enhance performance. In particular, vibrations in cooling system 400 that may affect other cooling cells (not shown), may be reduced. For example, less vibration may be induced in top plate 410 due to the motion of cooling element 420. Consequently, cross talk between cooling system 400 and other cooling systems (e.g. other cells) or other portions of the device incorporating cooling system 400 may be reduced. Thus, performance may be further enhanced.

Figure 5A:
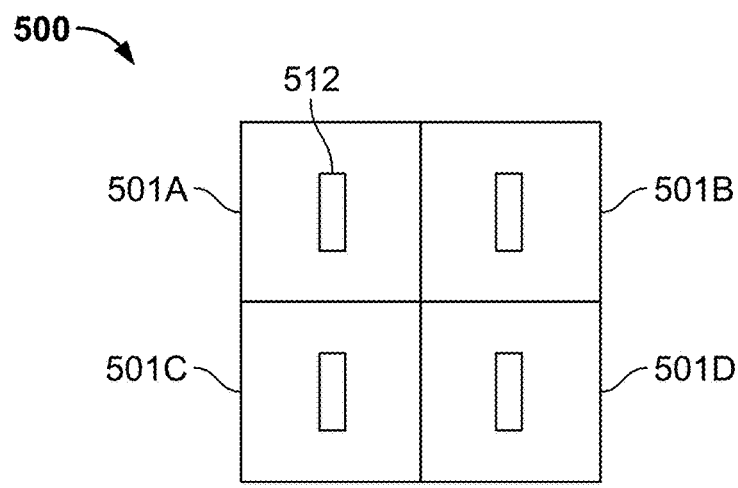
FIGS. 5A-5E depict an embodiment of an active cooling system formed in a tile.
Figure 5B:
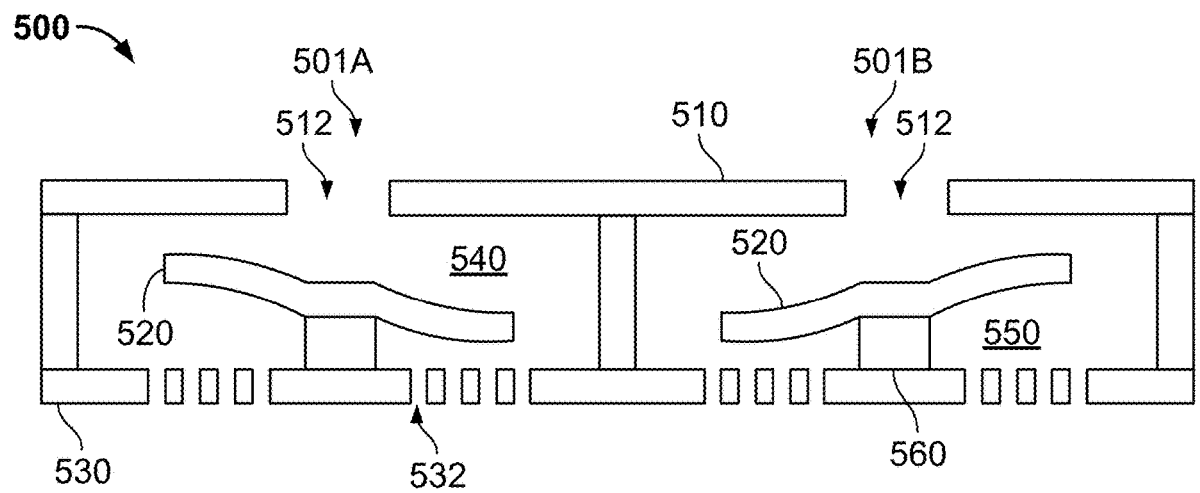
Figure 5C:
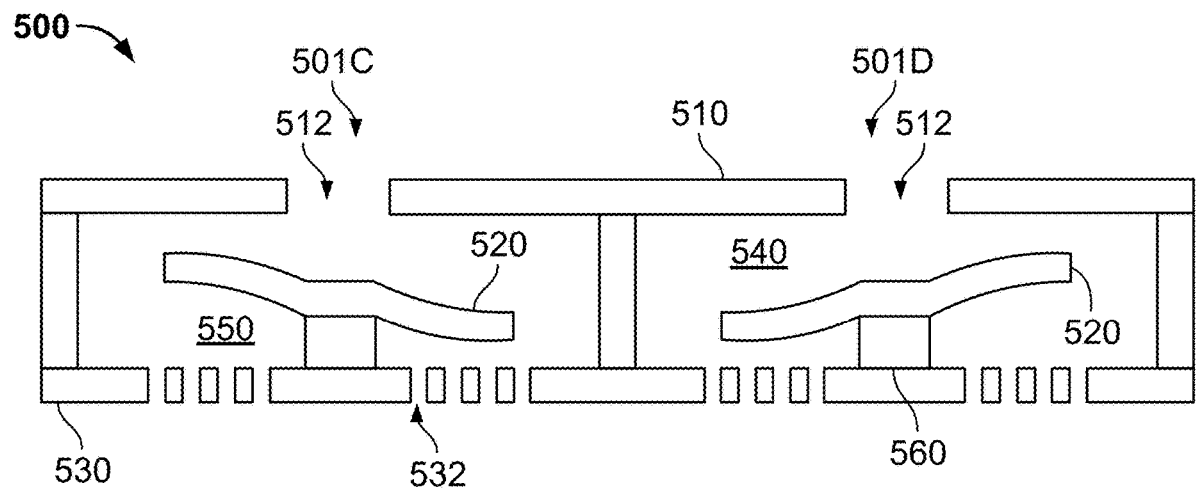
Figure 5D:
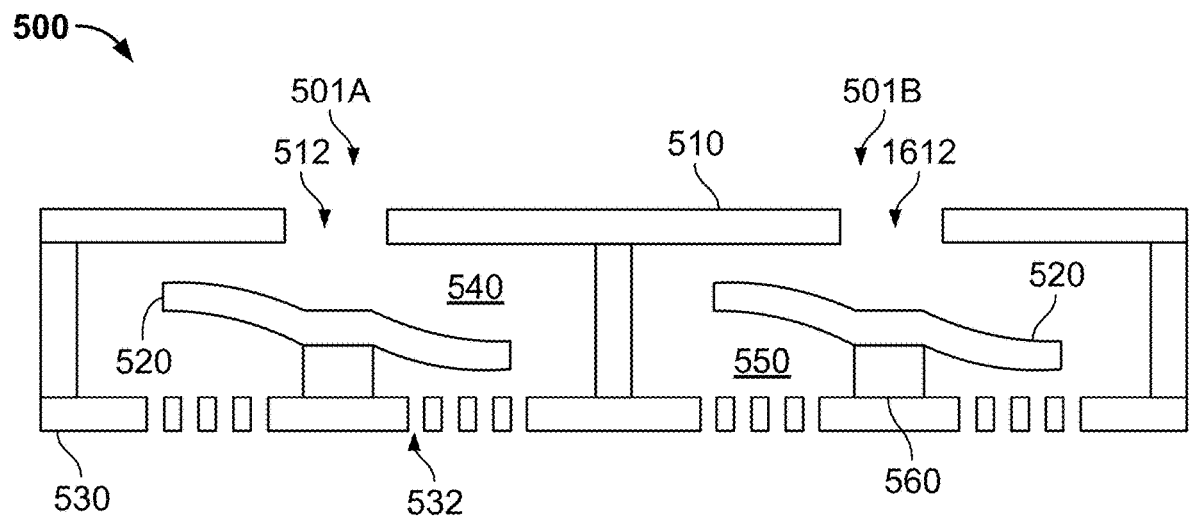
Figure 5E:
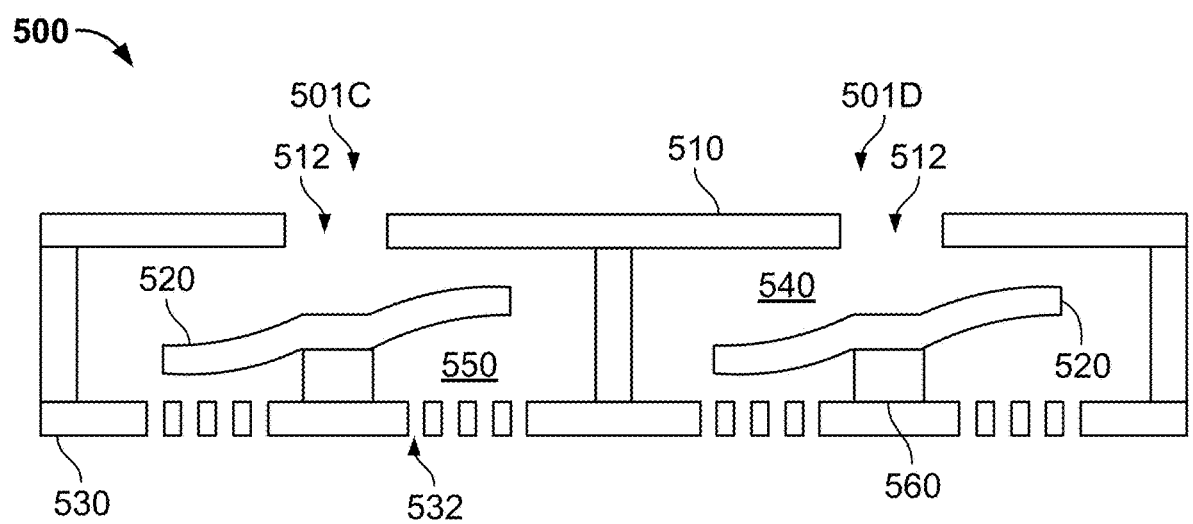

FIGS. 5A-5E depict an embodiment of active cooling system 500 including multiple cooling cells configured as a tile, or array. FIG. 5A depicts a top view, while FIGS. 5B-5E depict side views. FIGS. 5A-5E are not to scale. Cooling system 500 includes four cooling cells 501A, 501B, 501C and 501D (collectively or generically 501), which are analogous to one or more of cooling systems described herein. More specifically, cooling cells 501 are analogous to cooling system 100 and/or 400. Although four cooling cells 501 in a 2×2 configuration are shown, in some embodiments another number and/or another configuration of cooling cells 501 might be employed. In the embodiment shown, cooling cells 501 include shared top plate 510 having apertures 512, cooling elements 520, shared orifice plate 530 including orifices 532, top chambers 540, bottom chambers 550 and anchors (support structures) 560 that are analogous to top plate 110 having apertures 112, cooling element 120, orifice plate 130 having orifices 132, top chamber 140, bottom chamber 150 and anchor 160. In some embodiments, cooling cells 501 may be fabricated together and separated, for example by cutting through top plate 510, side walls between cooling cells 501, and orifice plate 530. Thus, although described in the context of a shared top plate 510 and shared orifice plate 530, after fabrication cooling cells 501 may be separated. In some embodiments, tabs (not shown) and/or other structures such as anchors 560, may connect cooling cells 501. Further, tile 500 may be affixed to a heat-generating structure (e.g. a heat sink, integrated circuit, or other structure) that may be part of an integrated system including tile 500 or may be separate from tile 500. In addition, a hood or other mechanism for directing fluid flow outside of cooling cells 501, mechanical stability, or protection may also be included. Electrical connection to cooling cells 501 is also not shown in FIGS. 5A-5E. Cooling elements 520 are driven out-of-phase (i.e. in a manner analogous to a seesaw). Further, as can be seen in FIGS. 5B-5C and FIGS. 5D-5E cooling element 520 in one cell is driven out-of-phase with cooling element(s) 520 in adjacent cell(s). In FIGS. 5B-5C, cooling elements 520 in a row are driven out-of-phase. Thus, cooling element 520 in cell 501A is out-of-phase with cooling element 520 in cell 501B. Similarly, cooling element 520 in cell 501C is out-of-phase with cooling element 520 in cell 501D. In FIGS. 5D-5E, cooling elements 520 in a column are driven out-of-phase. Thus, cooling element 520 in cell 501A is out-of-phase with cooling element 520 in cell 501C. Similarly, cooling element 520 in cell 501B is out-of-phase with cooling element 520 in cell 501D. By driving cooling elements 520 out-of-phase, vibrations in cooling system 500 may be reduced.

Cooling cells 501 of cooling system 500 functions in an analogous manner to cooling system(s) 100, 400, and/or an analogous cooling system. Consequently, the benefits described herein may be shared by cooling system 500. Because cooling elements in nearby cells are driven out-of-phase, vibrations in cooling system 500 may be reduced. Because multiple cooling cells 501 are used, cooling system 500 may enjoy enhanced cooling capabilities. Further, multiples of individual cooling cells 501 and/or cooling system 500 may be combined in various fashions to obtain the desired footprint of cooling cells.

Figure 6A:
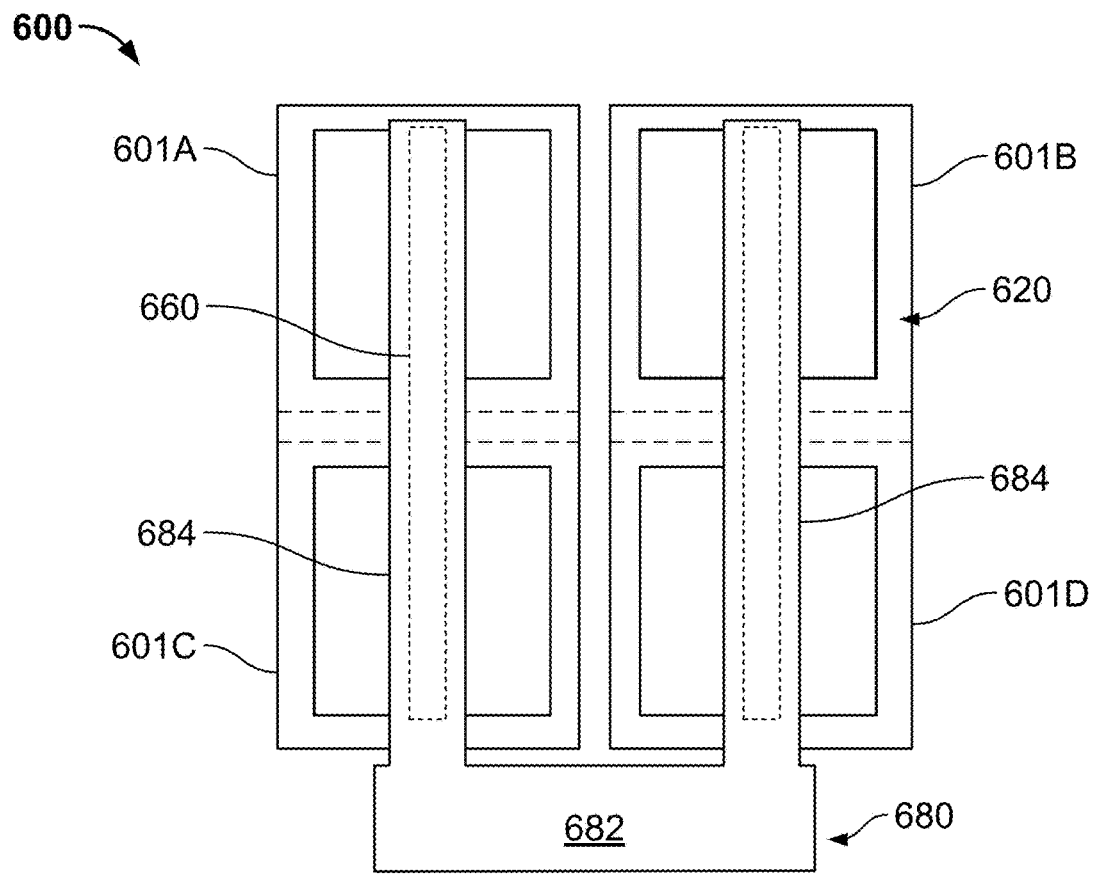
FIGS. 6A-6C depict an embodiment of an active cooling system formed in a tile.
Figure 6B:
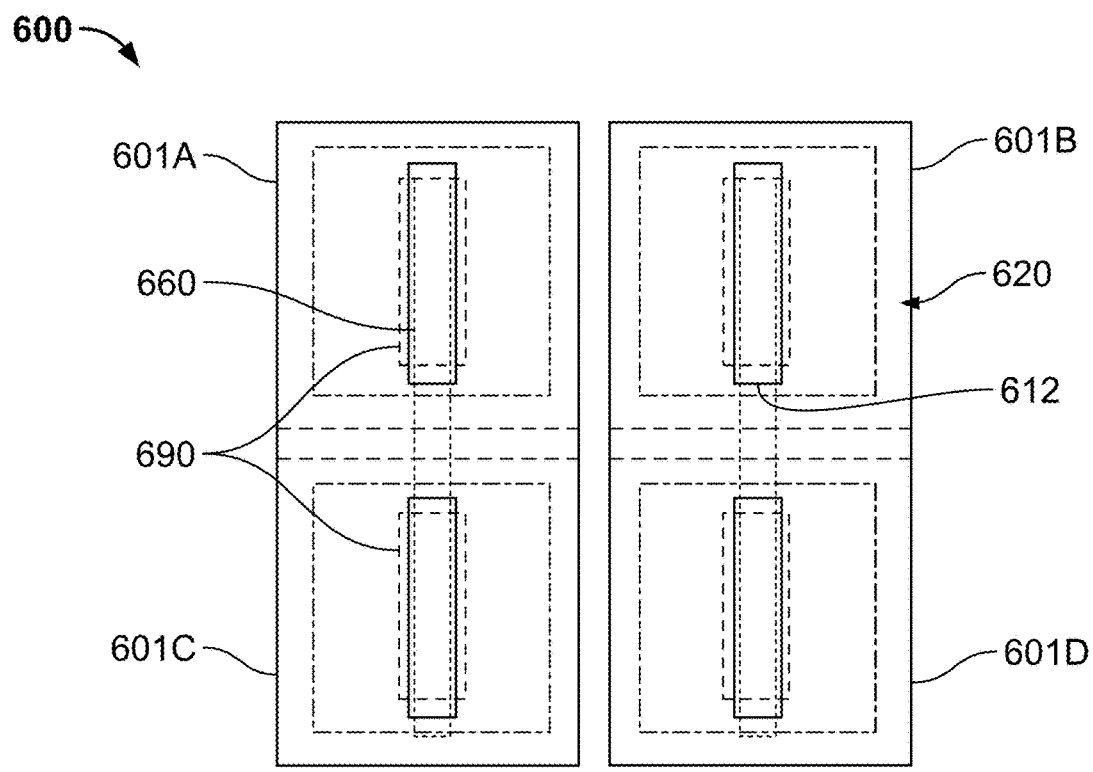
Figure 6C:
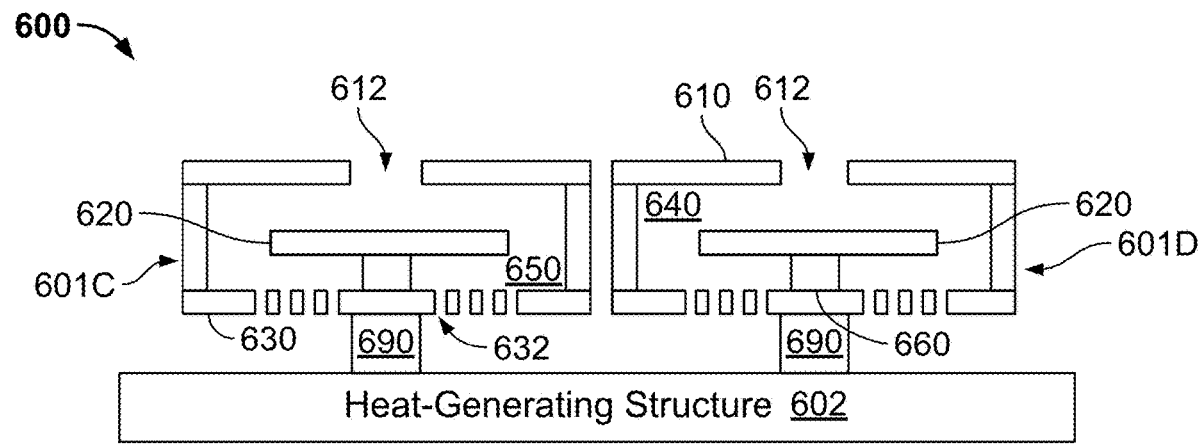

FIGS. 6A-6C depict an embodiment of active cooling system 600 including multiple cooling cells configured as a tile, or array. FIG. 6A depicts a top view with the top plate removed showing the electrical connections to cells 601. FIG. 6B depicts a top view of system 600. FIG. 6C depicts a side/cross-sectional view of system 600 as used to cool heat-generating structure 602. FIGS. 6A-6C are not to scale. Cooling system, or tile, 600 includes four cooling cells 601A, 601B, 601C and 601D (collectively or generically 601), which are analogous to one or more of cooling systems described herein. More specifically, cooling cells 601 are analogous to cooling system 100, 200, 400, 501 and/or another cooling system. Although four cooling cells 601 in a 2×2 configuration are shown, in some embodiments another number and/or another configuration of cooling cells 601 might be employed. In the embodiment shown, cooling cells 601 include top plate 610 having vents 612, cooling elements 620, orifice plate 630 including orifices 632, top chambers 640, bottom chambers 650 and anchors (support structures) 660 that are analogous to top plate 110 having apertures 112, cooling element 120, orifice plate 130 having orifices 132, top chamber 140, bottom chamber 150 and anchor 160. Also shown are electrical connector 680 (shown in FIG. 6A only) and pedestals 690 (shown in FIG. 6C only). Cooling elements 620 may be driven out-of-phase (i.e. in a manner analogous to a seesaw) or in phase (i.e. in a manner analogous to a butterfly). In some embodiments, cooling elements 620 are driven in a manner analogous to that shown in FIGS. 5B-5C or FIGS. 5D-5E.

Referring back to FIGS. 6A-6C, in some embodiments, cooling cells 601 may be fabricated together and separated, for example by cutting through top plate 610, orifice plate 630, and any layers, such as a layer of cooling elements 620, between top plate 610 and orifice plate 630. Cooling cells 601 have been separated by cutting through top plate 610 and orifice plate 630 in a direction parallel to the axis of anchor 660. Thus, cells 601A and 601C are physically connected, cells 601B and 601D are connected, cell 601A and 601B are physically disconnected, and cells 601C and 601D are physically disconnected. In some embodiments, individual cells might be separated along dashed lines perpendicular to anchor 660. In such embodiments, cells 601 along the axis of anchor 660 may still be coupled by anchor 660. In some embodiments, pedestal 690 may extend along the axis. In such embodiments, therefore, pedestals 690 may connect cells 601 along the axis of anchor 660. Because cells 601A and 601B and cells 601C and 601D are at least partially disconnected, cells 601 are better isolated against vibrations from the actuation of cooling elements 620 of other cells 601. Although cells 601 are at least partially disconnected, cells 601 are physically connected through anchors 660, pedestals 690, and/or other features such as tabs (not shown in FIGS. 6A-6C) such that cells 601 may be considered to be integrated into a single cooling system, or tile 600.

Cooling cells 601 of tile 600 are driven via electrical connector 680, which may be a flex connector. Electrical connector 680 includes tile portion 682 and cell portions 684. Cell portions 684 provide electrical connection to cooling elements 620 in the connected cells 601 along the axis of anchor 660. Because cell portions 684 of electrical connector 680 are aligned with anchor 660, vibrations in cooling system 600 may be reduced. This is because cell portions 684 are aligned with the anchor region of cells 601, which undergo less motion due to vibration of cooling elements 620. Thus, fewer vibrations are introduced into cell portions 684 of electrical connector 680. Further, because cell portions 684 are separated based on the alignment of the corresponding cells 601, vibrations from one cell (e.g. 601A or 601C) are less likely to be communicated to another cell (e.g. cell 601B and 601D). Thus, cooling system 600 may be subject to less vibration. Although tile portion 682 is shown as terminating outside of the perimeter (or footprint) of cooling cells 601, in some embodiments, tile portion 682 may extend into the footprint of cooling cells 601 (e.g. cells 601C and 601D).

Cooling system/tile 600 is coupled to heat-generating structure 602 by pedestals 690. In some embodiments, heat-generating structure 602 is a heat spreader that may be coupled to another structure that generates heat, such as an integrated circuit, another heat spreader or another vapor chamber. Heat-generating structure 602 may thus be part of a module that integrates tile 600 and heat-generating structure/heat spreader 602. Pedestals 690 are aligned with and extend in the direction of anchors 660. Thus, each cooling cell 601 is coupled to heat-generating structure 602 at the region subject to less vibration (i.e. in proximity to anchor 660). As a result, less vibration from cooling cells 601 is transmitted to heat-generating structure 602. In some embodiments, pedestal 690 is thermally conductive. A high thermal conductivity (e.g. on the order of that of copper and/or other materials of a heat spreader) allows heat to be transferred from heat-generating structure 602 to cooling cells 601 via conduction. Operation of tile 600 cools not only heat-generating structure 602 via convection (e.g. fluid driven by cooling elements 620), but also via conduction (e.g. heat conducted via pedestal 690 to cooling cells 601) in combination with convection (e.g. fluid driven by cooling elements 620 that carries heat from the components of tile 600). In some embodiments, pedestal 690 is a thermally conductive epoxy or other analogous adhesive. In some embodiments, pedestal 690 is a structure, such as a copper pedestal, which is affixed to heat-generating structure 602 and cooling cells 601. In some embodiments, pedestals 690 are configured to reduce the transmission of vibrations between tile 600 and heat-generating structure 602.

Cooling cells 601 of cooling system 600 function in an analogous manner to cooling system(s) 100, 400, 500 and/or an analogous cooling system. Consequently, the benefits described herein may be shared by cooling system 600. Because cooling elements in nearby cells 601 can be driven out-of-phase, vibrations in cooling system 600 may be reduced. Further, the configuration of electrical connector 680, the configuration and location of pedestal 690 and separation of cells 601 not aligned along the axis of anchor 660 further reduces the vibrations within cooling system 600 and the communication of vibrations to heat-generating structure 602. Because multiple cooling cells 601 are used, cooling system 600 may enjoy enhanced cooling capabilities. Further, multiples of individual cooling cells 601 and/or cooling system 600 may be combined in various fashions to obtain the desired footprint of cooling cells. Thus, performance may be improved.

Figure 7A:
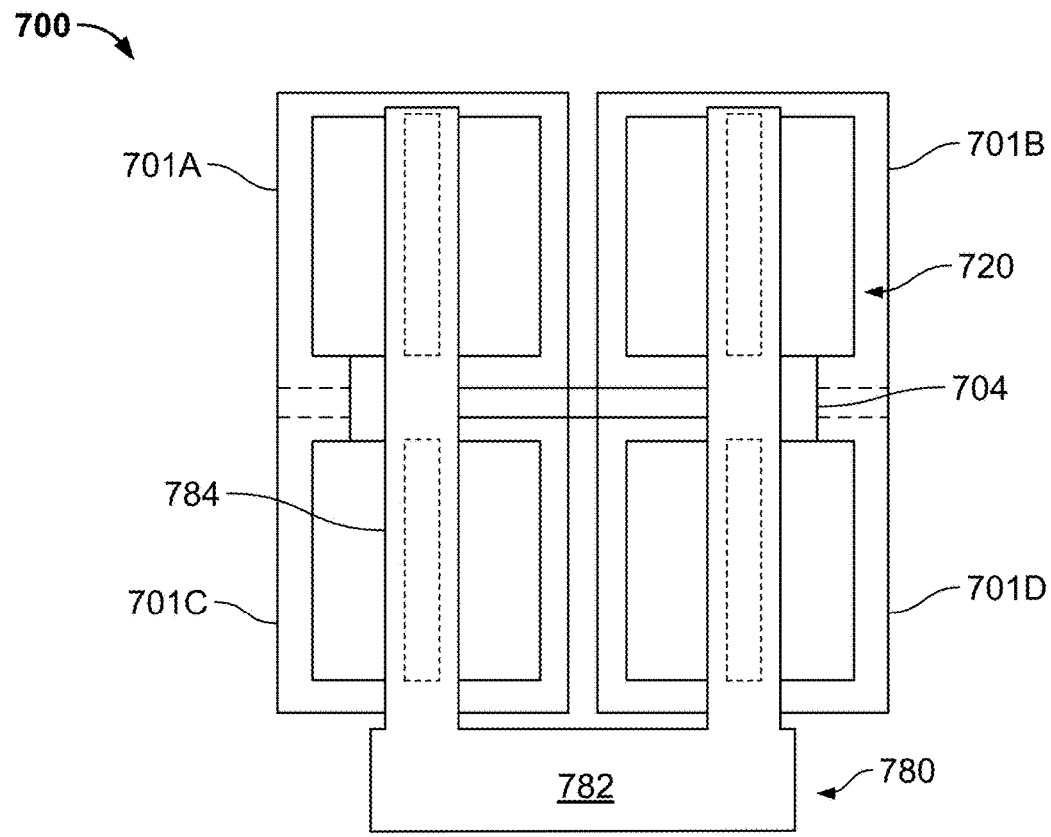
FIGS. 7A-7C depict an embodiment of an active cooling system formed in a tile.
Figure 7B:
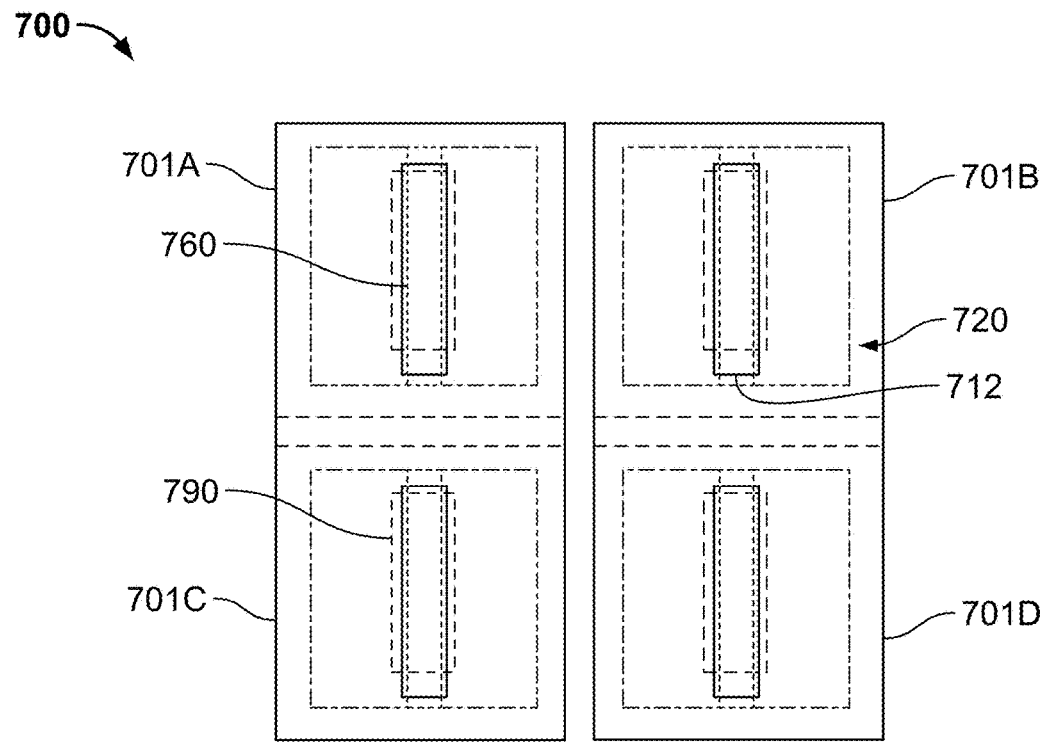
Figure 7C:
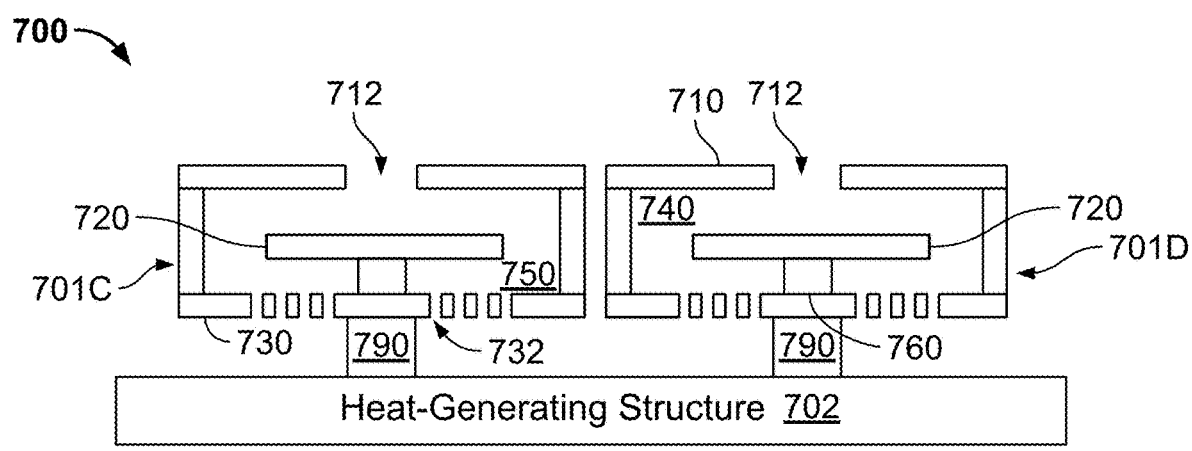

FIGS. 7A-7C depict an embodiment of active cooling system 700 including multiple cooling cells configured as a tile, or array. FIG. 7A depicts a top view of system 700 with the top plate removed. FIG. 7B depicts a top view of system 700. FIG. 7C depicts a side view of system 700 as used to cool heat-generating structure 702. FIGS. 7A-7C are not to scale. Cooling system 700 includes four cooling cells 701A, 701B, 701C and 701D (collectively or generically 701), which are analogous to one or more of cooling systems described herein. More specifically, cooling cells 701 are analogous to cooling system 100, 400, 501, and/or another cooling system. Although four cooling cells 701 in a 2×2 configuration are shown, in some embodiments another number and/or another configuration of cooling cells 701 might be employed (for example 4×1 and/or m×n arrays). Cooling system 700 is also analogous to cooling system 600. Consequently, analogous components have similar labels. In the embodiment shown, cooling cells 701, top plate 710 having vents 712, cooling elements 720, orifice plate 730 including orifices 732, top chambers 740, bottom chambers 750, anchors (support structures) 760, electrical connector 780 (shown only in FIG. 7A) and pedestals 790 (shown only in FIG. 7C) are analogous to cooling cells 601, top plate 610 having vents 612, cooling elements 620, orifice plate 630 including orifices 632, top chambers 640, bottom chambers 650, anchors (support structures) 660, electrical connector 680 and pedestals 690. Cooling elements 720 may be driven out-of-phase (i.e. in a manner analogous to a seesaw) or in-phase (i.e. in a manner analogous to a butterfly). In some embodiments, cooling elements 720 are driven in a manner analogous to that shown in FIGS. 5B-5C or FIGS. 5D-5E.

Referring back to FIGS. 7A-7C, although anchors 760 are shown as separated to be limited to individual cells, the vibration isolation characteristics of cooling cells 701 are analogous to those of cells 601. Also shown in FIG. 7A is tab 704 in proximity to anchors 760. Tabs 704 are aligned along the anchor and hence may reduce the cross-talk between the cells during operation. In some embodiments, tabs 704 may be omitted. Similarly, although pedestals 790 are shown as separate, in some embodiments, pedestals 790 may extend over multiple cells 701 such that cells may be considered to share a pedestal. Although cells 701 are at least partially disconnected, cells 701 may be physically connected through anchors 760, pedestals 790, tabs 704 and/or other features such that cells 701 may be considered to be integrated into a single cooling system, or tile 700. Cooling cells 701 of tile 700 are driven via electrical connector 780 in a manner analogous to cooling cells 601 of tile 600.

Cooling cells 701 of cooling system 700 function in an analogous manner to cooling system(s) 100, 400, 500, 600 and/or an analogous cooling system. Consequently, the benefits described herein may be shared by cooling system 700. Because cooling elements 720 in nearby cells can be driven out-of-phase, vibrations in cooling system 700 may be reduced. Further, the configuration of electrical connector 780, the configuration and location of pedestal 790 and separation of cells 701 not aligned along the axis of anchor 760 further reduces the vibrations within cooling system 700 and the communication of vibrations to heat-generating structure 702. Because multiple cooling cells 701 are used, cooling system 700 may enjoy enhanced cooling capabilities. Further, multiples of individual cooling cells 701 and/or cooling system 700 may be combined in various fashions to obtain the desired footprint of cooling cells. Thus, performance may be improved.

Figure 8:
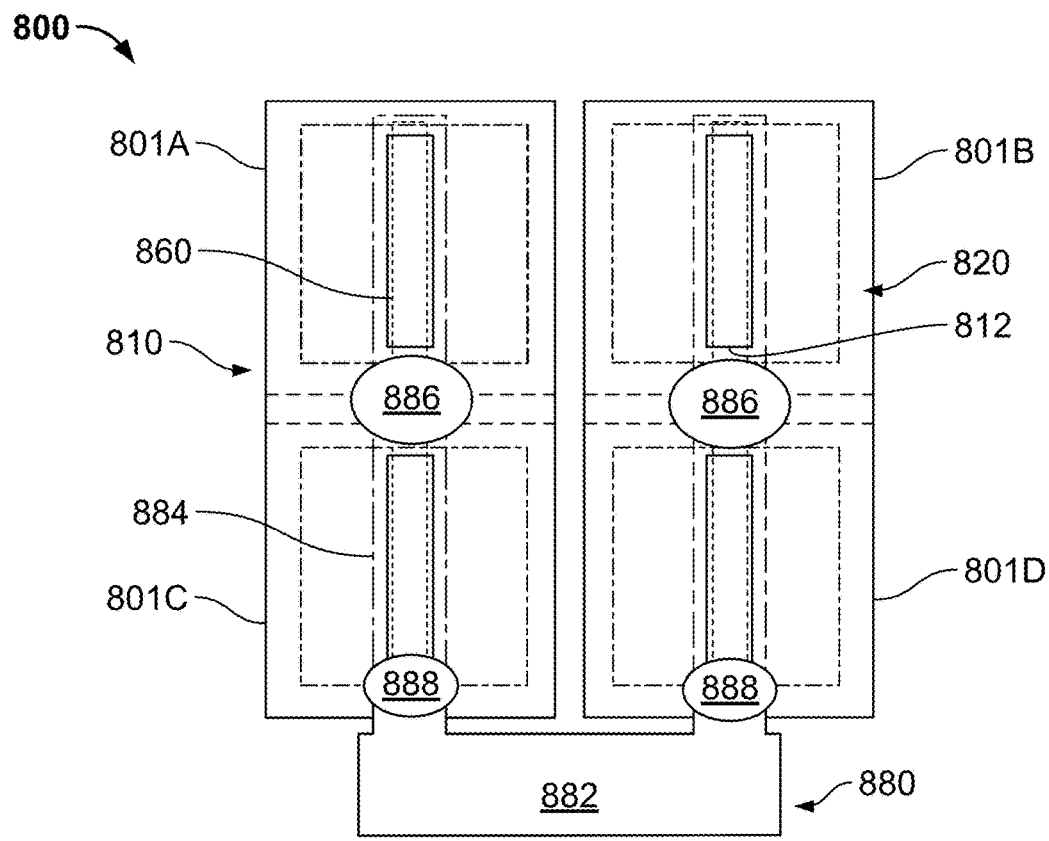
FIG. 8 depicts an embodiment of an active cooling system formed in a tile.

FIG. 8 depicts a top view of an embodiment of active cooling system 800 including multiple cooling cells configured as a tile, or array. Consequently, the orifice plate and pedestals are not shown. Cooling system 800 is analogous to cooling system 600 and/or 700. FIG. 8 is not to scale. Cooling system 800 includes four cooling cells 801A, 801B, 801C and 801D (collectively or generically 801), which are analogous to one or more of cooling systems described herein. More specifically, cooling cells 801 are analogous to cooling system 100, 400, 501, and/or another cooling system. Although four cooling cells 801 in a 2×2 configuration are shown, in some embodiments another number and/or another configuration of cooling cells 801 might be employed. Cooling system 800 is also analogous to cooling system(s) 600 and/or 700. Consequently, analogous components have similar labels. In the embodiment shown, cooling cells 801, top plate 810 having vents 812, cooling elements 820, orifice plate (not shown) including orifices (not shown) therein, top chamber (not shown), bottom chamber (not shown), anchors (support structures) 860, electrical connector 880 and pedestals (not shown) are analogous to cooling cells 601/701, top plate 610/710 having vents 612/712, cooling elements 620/720, orifice plate 630/730 including orifices 632/732, top chambers 640/740, bottom chambers 650/70, anchors (support structures) 660/760, electrical connector 680/780 and pedestals 690/790. Cooling elements 820 may be driven out-of-phase (i.e. in a manner analogous to a seesaw) or in-phase (i.e. in a manner analogous to a butterfly). Cell portions 884 of connector 880, cooling elements 820, and anchor 860 under top plate 810 are shown as dashed/dotted lines. In some embodiments, cooling elements 820 are driven in a manner analogous to that shown in FIGS. 5B-5C or FIGS. 5D-5E. Also shown in FIG. 8 are epoxy or silicone sealant 886 and 888 that may be utilized if cells 801 are desired to be closed. In order to electrically connect to cooling elements 820, cell portions 884 of electrical connector 880 enter cells 801. Sealant/epoxy 886 and 888 may be used to seal the apertures through which cell portions 884 enter or leave cells 801. Thus, fluid may enter cells 801 only or primarily through vents 812. Although shown in particular locations in cooling system 800, in some embodiments, epoxy or silicone sealant 886 and/or 888 may be located elsewhere or replaced with other material(s).

Cooling cells 801 of cooling system 800 function in an analogous manner to cooling system(s) 100, 400, 500, 600, 700 and/or an analogous cooling system. Consequently, the benefits described herein may be shared by cooling system 800. Because cooling elements 820 in nearby cells can be driven out-of-phase, vibrations in cooling system 800 may be reduced. Further, the configuration of electrical connector 880, the configuration and location of pedestal 890 and separation of cells 801 not aligned along the axis of anchor 860 further reduces the vibrations within cooling system 800 and the communication of vibrations to heat-generating structure 802. Because multiple cooling cells 801 are used, cooling system 800 may enjoy enhanced cooling capabilities. Further, multiples of individual cooling cells 801 and/or cooling system 800 may be combined in various fashions to obtain the desired footprint of cooling cells. Thus, performance may be improved.

Figure 9:
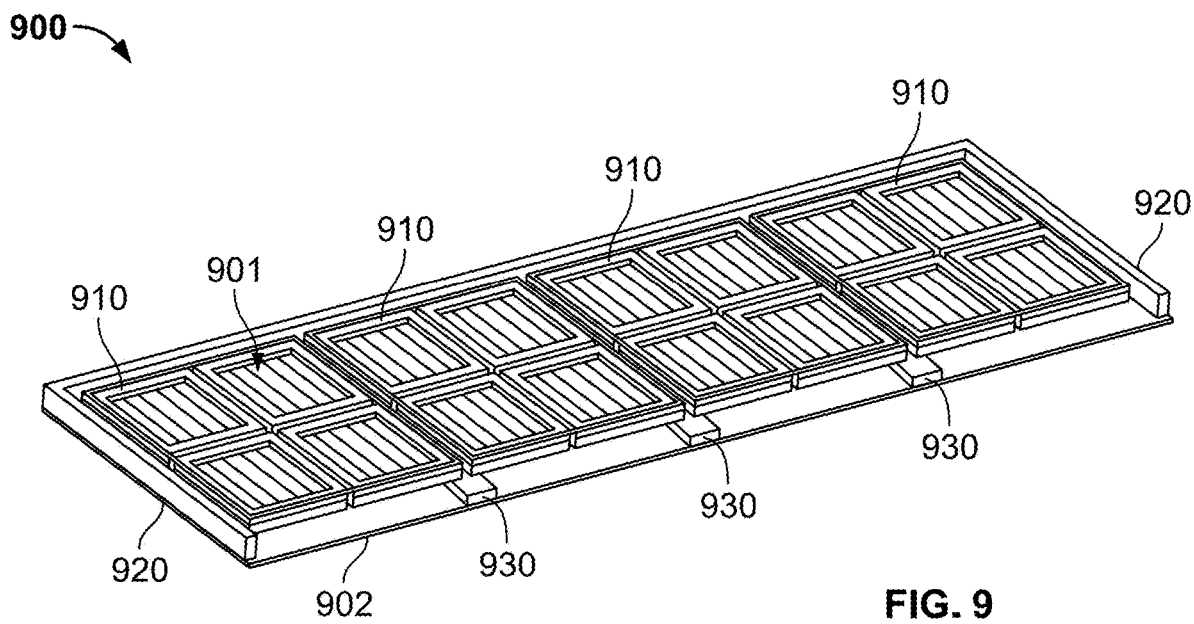
FIG. 9 depicts an embodiment of multiple tiles configured to be used in a computing device.
Figure 10A:
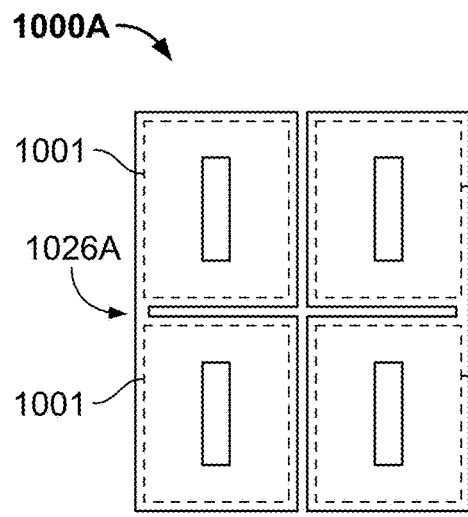
FIGS. 10A-10D depict embodiments of tiles having tabs that interconnect cells.
Figure 10B:
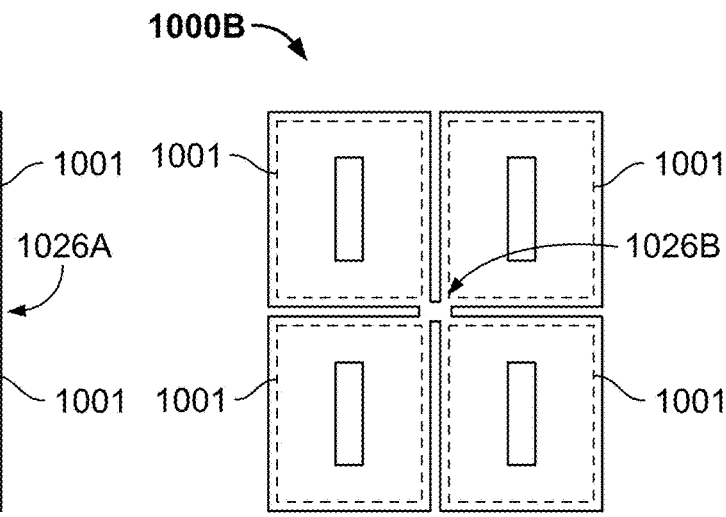
Figure 10C:
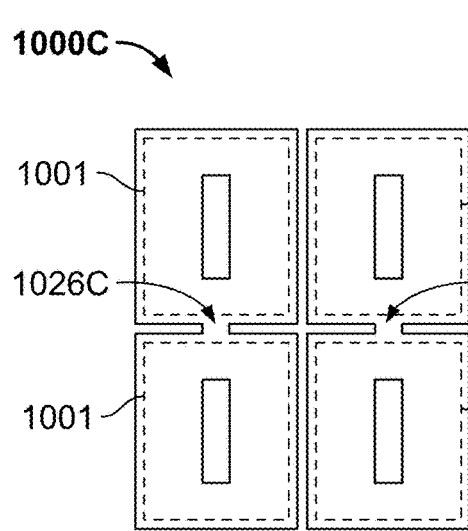
Figure 10D:
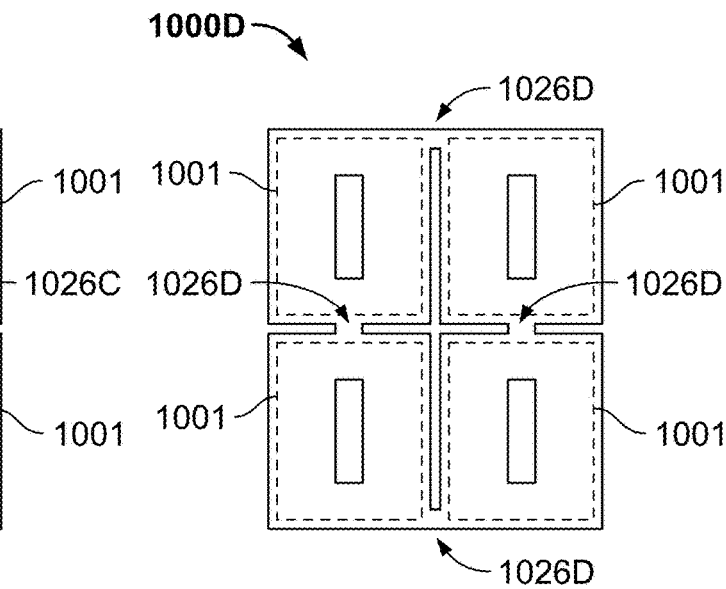

FIG. 9 depicts an embodiment of cooling system 900 including multiple tiles 910 configured to be used in cooling a computing device. For simplicity, only some features are shown or labeled. In addition to tiles 910, heat-generating structure 902, which is a heat spreader, is shown. Heat spreader 902 includes walls 930 between tiles 910. Also shown is fencing 920. In some embodiments, fencing 920 surrounds a portion of the perimeter of tiles 910. Fluid exiting cooling cells 901 thus travels along heat-generating structure 902, exiting at the region without fencing 920. In some embodiments, fencing 920 includes ducting that may be used to transfer fluid. Tiles 910 may, for example, be analogous to tiles 500, 600, 700 and/or 800. Cooling system 900 includes sixteen tiles cell 901, of which only one is labeled. Although shown in a 2×8 configuration, for other applications, tiles 910 may be arranged in another manner. Tiles 910 function in an analogous manner to tile(s) 500, 600, 700, 800 and/or an analogous cooling system. Consequently, the benefits described herein may be shared by cooling system 900. Because cooling elements in nearby cells within each tile 910 can be driven out-of-phase, and tiles 910 can be configured as described herein, vibrations in cooling system 900 may be reduced. Because multiple cooling tiles 910 are used, cooling system 900 may enjoy enhanced cooling capabilities. Further, multiples of individual tiles 910 may be combined in various fashions to obtain the desired footprint of cooling cells. Thus, performance may be improved.

FIGS. 10A, 10B, 10C, and 10D are diagrams depicting plan views of embodiments of cooling cells 1001 arranged in a tile 1000A, 1000B, 1000C, and 1000D (collectively or generically tiles 1000), respectively, and connected via tabs 1026A, 1026B, 1026C, and 1026D (collectively or generically tabs 1026), respectively. Only some portions of tiles 1000 are shown and FIGS. 10A-10D are not to scale. In the embodiments shown, four cooling cells 1001 are shown as arranged in each tile 1000. However, other numbers and/or other configurations may be used. The cooling cells 1001 may be considered at least partially separate. However, for mechanical stability during fabrication and for electrical connection during use, the cells 1001 may be desired to be connected. Tabs 1026 between cells 1001 may provide this stability. In some embodiments, tabs 1026 are in multiple layers of a tile 1000. Tabs 1026 may be etched into the thickness of the structure(s) forming cooling cells 1001. In some embodiments, tabs 1026 may be formed on a single layer, such as the top plate only. In some embodiments, tabs 1026 are separate structures that are coupled to tiles 1000 during fabrication. Tabs 1026 may thus be considered to be integrated into tile 1000. In some embodiments, tabs 1026 may be removed after fabrication. However, this may complicate electrical connection individually to each cell 1001.

FIGS. 11A, 11B, 11C, and 11D are diagrams depicting plan views of embodiments of cooling cells 1101 arranged in a tile 1100A, 1100B, 1100C, and 1100D (collectively or generically tiles 1100), respectively, and connected via tabs 1126A, 1126B, 1126C, and 1126D (collectively or generically tabs 1126), respectively. Only some portions of tiles 1100 are shown and FIGS. 11A-11D are not to scale. For simplicity, only some tabs are labeled. In the embodiments shown, a four cooling cells 1101 are shown as arranged in tiles 1100. A 2×2 configuration of cells 1101 is shown in tiles 1100A and 1100B. A 1×4 configuration of cells 1101 is shown in tiles 1100C and 1100D. Similarly, particular numbers and configurations of tabs 1126 are shown. However, other numbers and/or other configurations of tiles 1100 and/or tabs 1126 may be used.

Figure 11A:
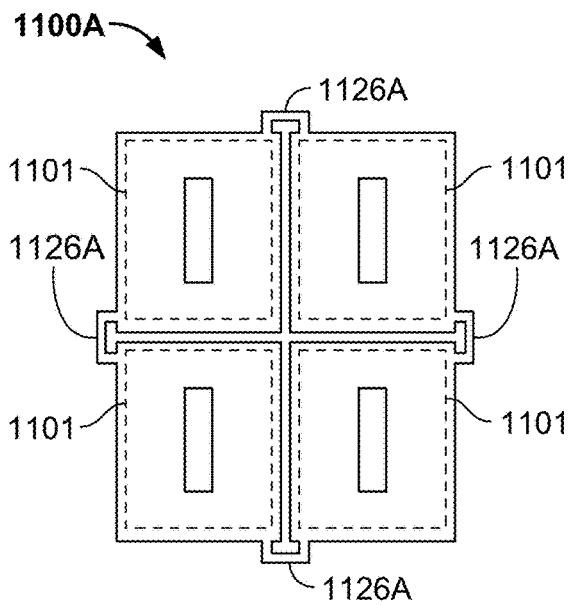
FIGS. 11A-11D depict embodiments of tiles having tabs that interconnect cells.
Figure 11B:
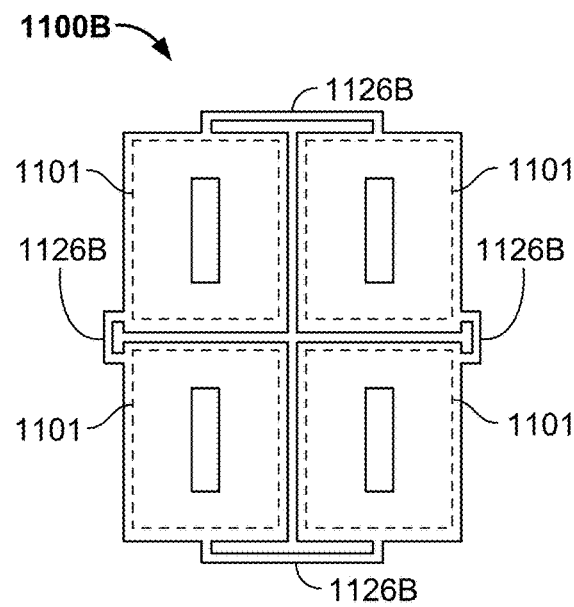
Figure 11C:
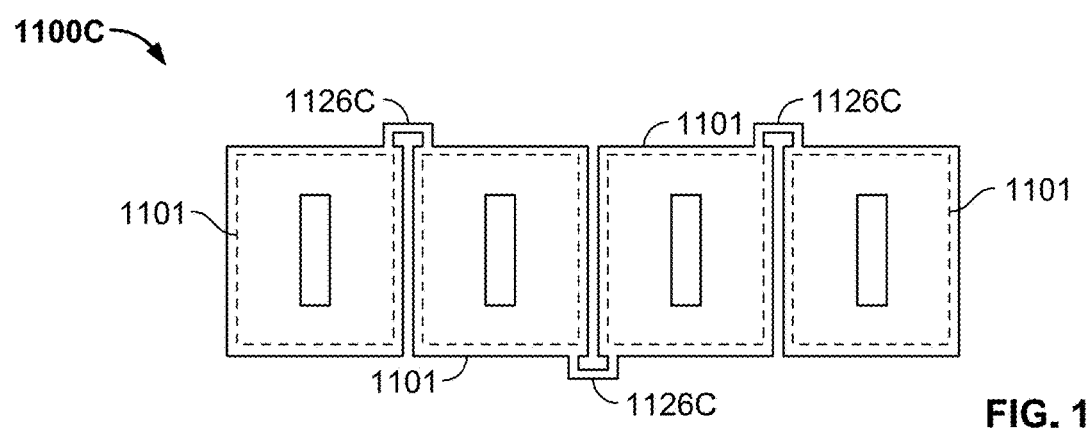
Figure 11D:
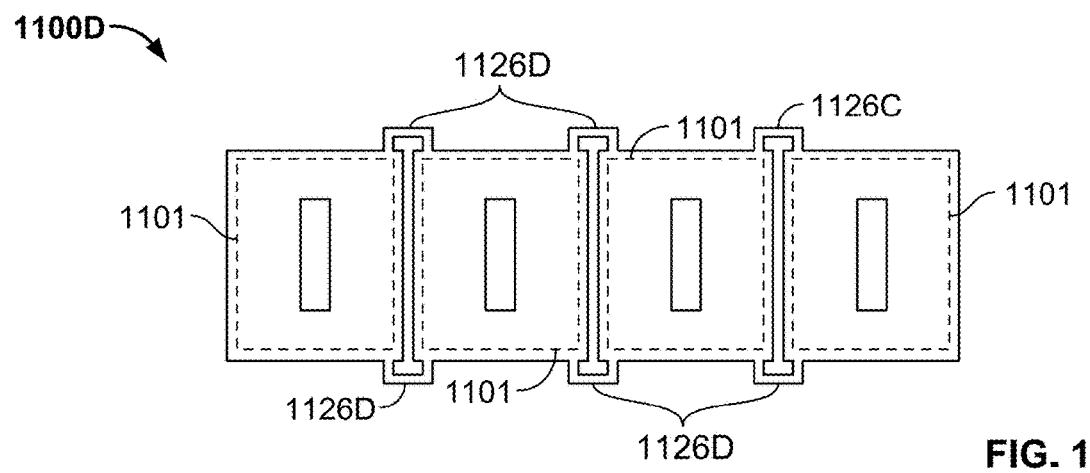

Tabs 1126 extend outside of the footprint of cooling cells 1101 and tile 1100. Stated differently, the tabs 1126 extend outside of the perimeter of tile 1100. Tabs 1126 are also shown as u-shaped. In some embodiments, another shape (e.g. M-shaped) may be used. In Further, as indicated in FIG. 11B, tabs 1126B on a particular tile 1100B need not be the same size. In some embodiments, tabs 1126 are 1-2 millimeters wide and 0.2-0.5 millimeters in width. In some embodiments, tabs 1126 are in multiple layers of a tile 1100. Tabs 1126 may be etched into the thickness of the structure(s) forming cooling cells 1101. For example, the tabs may be ⅓ to ½ of the thickness of sheets from which the orifice plate, cooling element, top plate and other structures are formed. These sheets may be laminated to form cooling cells 1101. For the jet channel (the distance between the heat spreader and the bottom of the orifice plate), the tab may be less than the thickness of the spacers or pedestals, but have a different thickness than tabs formed at the top plate or orifice plate. In some embodiments, tabs 1126 may be formed on a single layer, such as the top plate only. In some embodiments, tabs 1126 are separate structure s that are coupled to tiles 1100 during fabrication. Tabs 1026 may thus be considered to be integrated into tile 1000. In some embodiments, tabs 1126 have a maximum thickness of 300 microns. However other dimensions are possible. Tabs 1126 are compliant so that the communication of vibrations between cooling cells 1101 is reduced or eliminated. Electrical connection can be made through the tabs. Thus, the tabs may be designed to be used during operation. The tabs may be considered to act as low frequency springs, with a characteristic frequency of much less than the frequencies at which the actuators (not shown in FIGS. 11A-11D) are vibrated (on the order of twenty kilohertz). Thus, tabs 1126 provide mechanical connection for assembly and manufacturing and electrical connection during operation. As such, performance of tiles 1100 may be improved.

FIGS. 12A-12G depict an embodiment of tile 1200 during fabrication. Tile 1200 800 is analogous to cooling system(s)

Figure 12A:
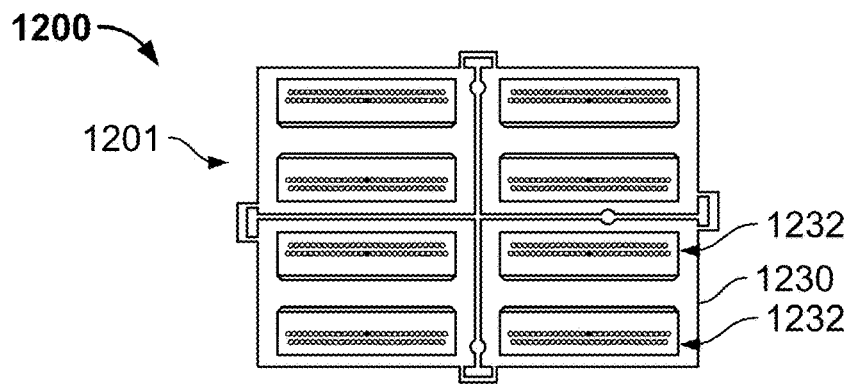
FIGS. 12A-12G depict an embodiment of a tile during fabrication.
Figure 12B:
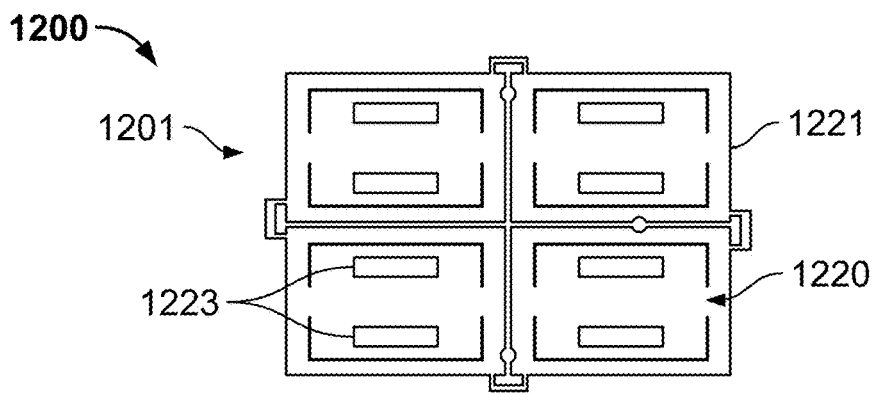

600, 700, 800, and/or 900. FIGS. 12A-12G are not to scale. Tile 1200 includes four cooling cells 1201 of which one is labeled. Although four cooling cells 1201 in a 2×2 configuration are shown, in some embodiments another number and/or another configuration of cooling cells 1201 might be employed. Cells 1201 are analogous to one or more of cooling cells described herein (e.g. cooling cell(s) 100, 400, and/or 501). Cooling system 1200 is also analogous to cooling system(s) 600, 700, and/or 200. Consequently, analogous components have similar labels. FIG. 12A depicts a plan view of orifice plate 1230 including orifices 1232 therein. In some embodiments, orifice plate 1230 is part of a sheet or other structure including multiple orifice plates 1230. Although not labeled, orifice plate 1230 includes tabs at the sides, outside the footprint of the tile 1200 or cooling cells 1201. FIG. 12B depicts a plan view of cooling system 1200 after active element plate 1221 has been added to orifice plate 1230 (not shown in FIG. 12B). In some embodiments, active element plate 1210 is part of a sheet or other structure including multiple active element plates 1210. Thus, cooling elements 1220 are shown. Anchors (not shown in FIG. 12B) may be formed on the opposing surface of active element plate 1221, on the surface shown of orifice plate 1230, or may be formed by an epoxy or other material used to attach orifice plate 1230 and active element plate 1221. Tabs are also present but unlabeled on active element plate 1221. Also depicted in FIG. 12B are piezoelectric structures 1223. Piezoelectric structures 1223 are used to drive vibrational motion of cooling elements 1220. In some embodiments, another mechanism for driving cooling elements 1220 may be used.

Figure 12C:
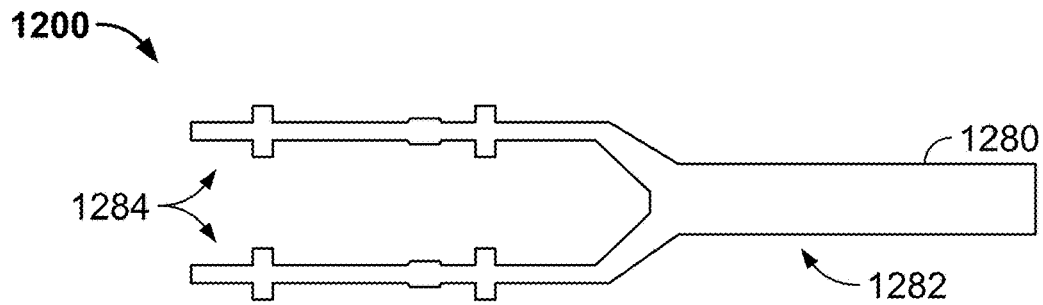
Figure 12D:
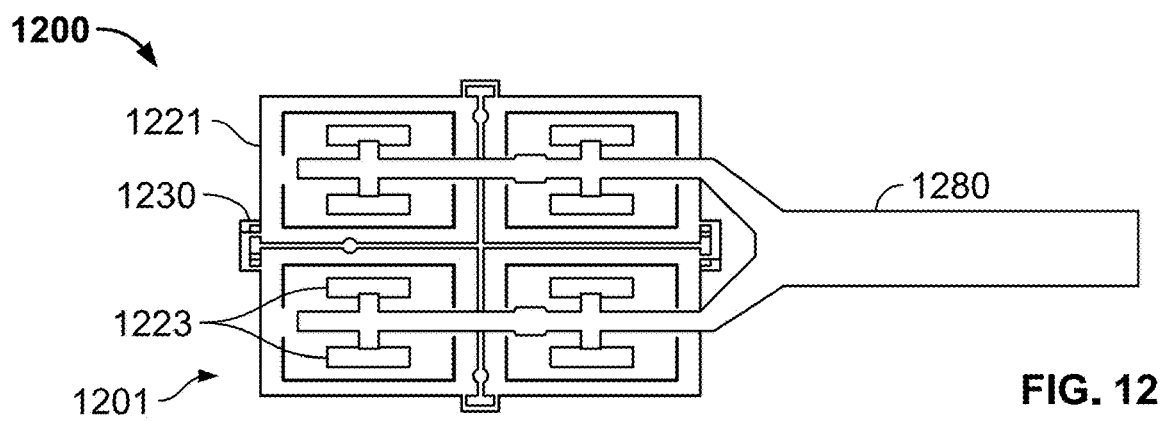

FIG. 12C depicts electrical connector 1280, which may be a flex connector. Tile portion 1282 and cell portion 1284 are indicated. FIG. 12D depicts tile 1200 after connector 1280 has been attached to active element plate 1221. More specifically, connection has been made between electrical connector 1280 and piezoelectric structures 1223. If multiple tiles are being fabricated, then electrical connector 1280 may be provided for each tile.

Figure 12E:
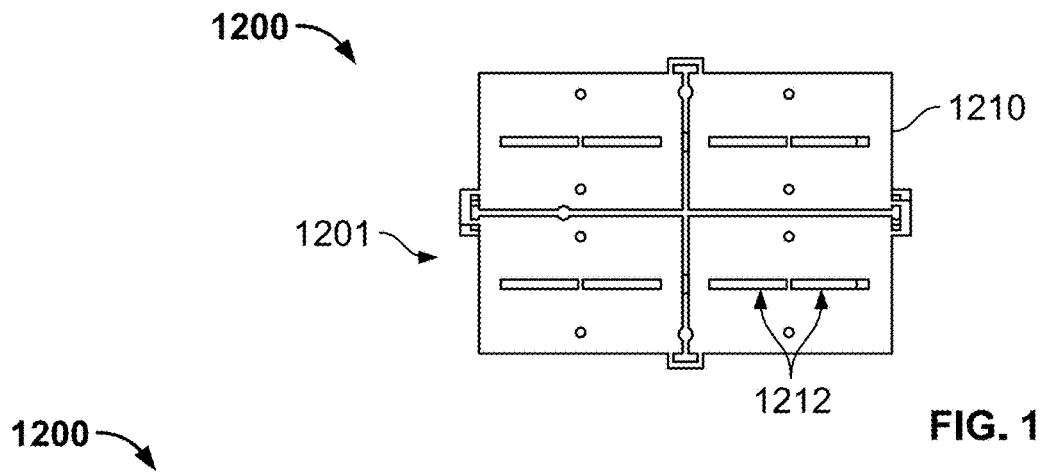
Figure 12F:
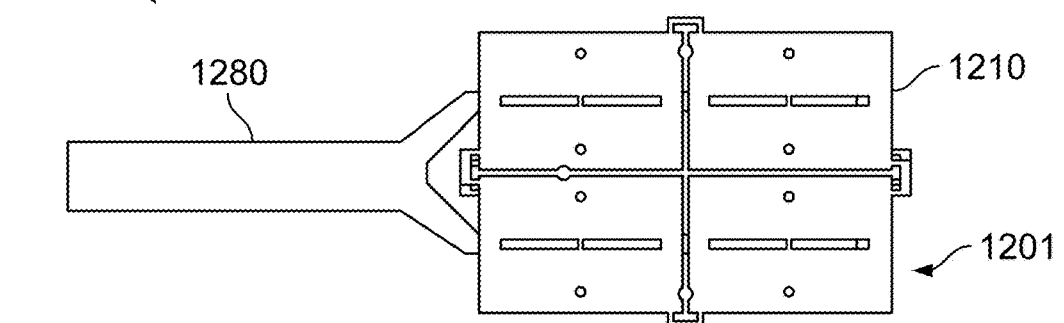
Figure 12G:
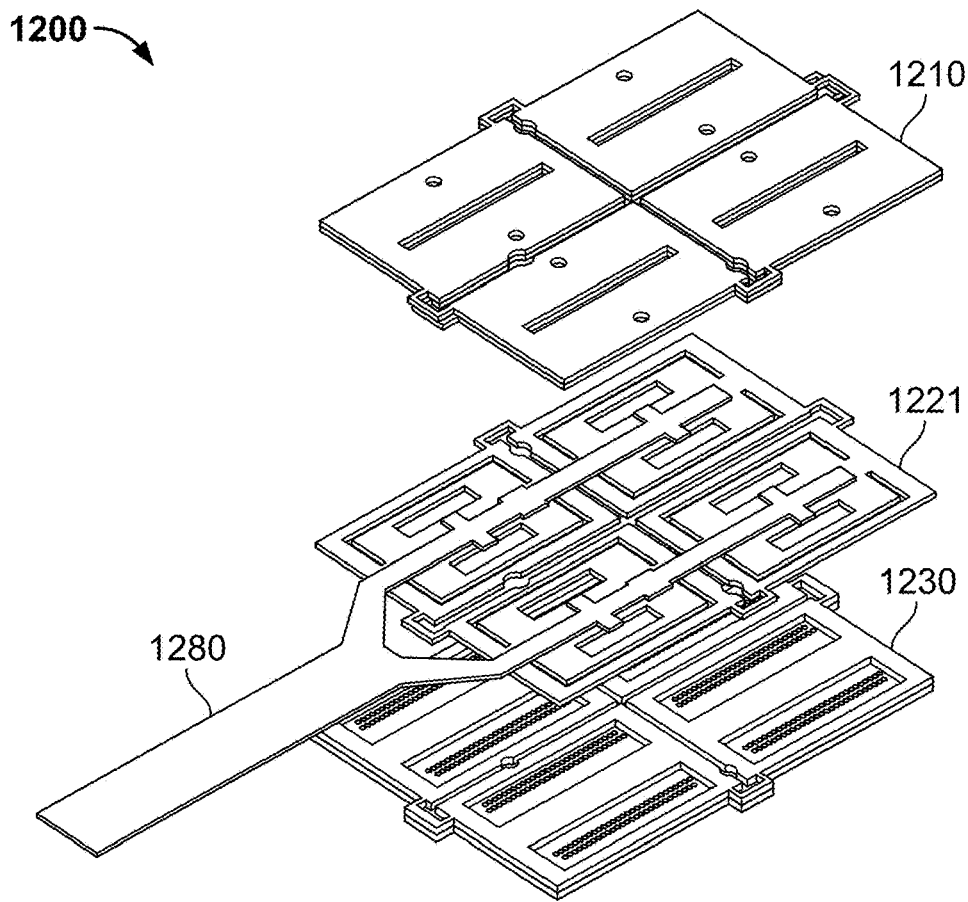

FIG. 12E depicts top plate 1210 having vents 1212 therein. Although a particular number and placement of vents 1212 is shown, other configurations are possible. In some embodiments, top plate 1210 is part of a sheet or other structure including multiple top plates 1210. FIGS. 12F and 12G depict top and exploded views of tile 1200 after top plate has been coupled to the remaining structures. If multiple tiles are formed from a sheet or other structure than individual tiles or desired configurations of tiles are separated from the sheet or other structure. For example, laser cutting may be performed. Subsequently, other structures, such as a heat spreader, may be attached to tile 1200 to form a cooling module. Thus, tiles 1200 may be more readily assembled. Consequently, some or all of the benefits of the active cooling structures described may be achieved.

Although various configurations are described herein, features of cooling systems 100, 400, 500, 600, 700, 800, 900, 1000, 1100 and/or 1200 may be combined in various manners not explicitly discussed herein. Consequently, devices incorporating cooling systems 100, 400, 500, 600, 700, 800, 900, 1000, 1100, 1200, and/or analogous cooling systems may be enhanced.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a plurality of cooling cells, each of the plurality of cooling cells including a support structure and a cooling element, the cooling element having a central region having an axis and a perimeter, the plurality of cooling cells including a first cooling cell, a second cooling cell, a third cooling cell, and a fourth cooling cell, the cooling element being supported by the support structure at the central region and along the axis, at least a portion of the perimeter being unpinned, the cooling element being configured to undergo vibrational motion when actuated to drive a fluid toward a heat-generating structure, wherein a first portion of the plurality of cooling cells includes the first cooling cell and the second cooling cell, wherein the first cooling cell is physically connected to the second cooling cell, and wherein the first cooling cell and the second cooling cell are aligned along the axis such that the plurality of cooling cells form an integrated cooling cell tile;
a plurality of integrated tabs mechanically connecting a second portion of the plurality of cooling cells, wherein the second portion includes the third cooling cell and the fourth cooling cell; and
an electrical connector including at least one longitudinal electrical connector extending along the axis and coupled to the first portion of the plurality of cooling cells along the axis.

2. The system of claim 1, further comprising:
an electrical connection coupled to each of the first cooling cell and the second cooling cell of the plurality of cooling cells along the axis.

3. The system of claim 1, further comprising:
a pedestal coupling each of the first cooling cell and the second cooling cell of the plurality of cooling cells to the heat-generating structure, the pedestal being aligned with the axis.

4. The system of claim 3, wherein the first cooling cell and the second cooling cell of the plurality of cooling cells along the axis are physically connected by the pedestal.

5. The system of claim 1, wherein the portion first cooling cell and the second cooling cell of the plurality of cooling cells along the axis are physically connected by a shared support structure forming the support structure each of the first cooling cell and the second cooling cell of the plurality of cooling cells.

6. The system of claim 1, wherein the plurality of cooling cells are mechanically connected by at least one tab residing outside of a footprint of the plurality of cooling cells.

7. The system of claim 1, wherein:
the plurality of cooling cells including a fifth cooling cell and a sixth cooling cell; and
the system further comprises:
an additional plurality of cooling cells, each of the additional plurality of cooling cells including an additional support structure and an additional cooling element, the additional cooling element having an additional central region having an additional axis and an additional perimeter, the additional cooling element being supported by the additional support structure at the additional central region and along the additional axis, at least a portion of the additional perimeter being unpinned, the additional cooling element being configured to undergo the vibrational motion when actuated to drive the fluid toward the heat-generating structure, the fifth cooling cell and the sixth cooling cell of the additional plurality of cooling cells aligned along the additional axis being physically connected such that the additional plurality of cooling cells form an additional integrated cooling cell tile; and wherein the integrated cooling cell tile and the additional integrated cooling cell tile are coupled to the heat-generating structure.

8. A method, comprising:

providing a plurality of cooling cells, each of the plurality of cooling cells including a support structure and a cooling element, the cooling element having a central region having an axis and a perimeter, the plurality of cooling cells including a first cooling cell, a second cooling cell, a third cooling cell, and a fourth cooling cell, the cooling element being supported by the support structure at the central region and along the axis, at least a portion of the perimeter being unpinned, the cooling element being configured to undergo vibrational motion when actuated to drive a fluid toward a heat-generating structure, wherein a first portion of the plurality of cooling cells includes the first cooling cell and the second cooling cell, wherein the first cooling cell is physically connected to the second cooling cell, and wherein the first cooling cell and the second cooling cell are aligned along the axis such that the plurality of cooling cells form an integrated cooling cell tile;

providing a plurality of integrated tabs mechanically connecting a second portion of the plurality of cooling cells, wherein the second portion includes the third cooling cell and the fourth cooling cell; and providing an electrical connector including at least one longitudinal electrical connector extending along the axis and coupled to the first portion of the plurality of cooling cells along the axis.

9. The method of claim 8, further comprising:

providing an electrical connection coupled to each of the first cooling cell and the second cooling cell of the plurality of cooling cells along the axis.

10. The method of claim 8, further comprising:

providing a pedestal configured to couple each of the first cooling cell and the second cooling cell of the plurality of cooling cells to the heat-generating structure, the pedestal being aligned with the axis.

11. The method of claim 10, wherein the first cooling cell and the second cooling cell of the plurality of cooling cells along the axis are physically connected by the pedestal.

12. The method of claim 8, wherein the providing the plurality of cooling cells further includes:

providing the support structure as a shared support structure, the first cooling cell and the second cooling cell of the plurality of cooling cells along the axis being physically connected by the shared support structure.

13. The method of claim 8, wherein the providing the plurality of cooling cells further includes:

mechanically connecting the third cooling cell and the fourth cooling cell of the plurality of cooling cells by at least one tab, the at least one tab residing outside of a footprint of the plurality of cooling cells.

* * * * *